United States Patent
Maeda et al.

(10) Patent No.: US 6,414,353 B2
(45) Date of Patent: Jul. 2, 2002

(54) TFT WITH PARTIALLY DEPLETED BODY

(75) Inventors: Shigenobu Maeda; Shigeto Maegawa, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/265,697

(22) Filed: Mar. 10, 1999

(30) Foreign Application Priority Data

Aug. 7, 1998 (JP) ............................................. 10-224284

(51) Int. Cl.[7] .............................................. H01L 29/00
(52) U.S. Cl. ...................... 257/347; 257/348; 257/336; 257/408
(58) Field of Search ................................ 257/347–355, 257/377, 382, 408, 336

(56) References Cited

U.S. PATENT DOCUMENTS 5,289,027 A * 2/1994 Terrill et al. .................... 257/44
5,854,561 A * 12/1998 Arimoto et al. ............. 327/534

OTHER PUBLICATIONS

A Highly Reliable 0.35 μm Fiels –Shield Body–Tied SOI Gate Array for Substrate–Bias–Effect Free Operation, S. Maeda et al, 1997 Symposium on VLSI Technology Digest of Technical Papers, pp. 93–94.
Cad–Compatible High–Speed CMOS/SIMOX Technology Using Field–Shield Isolation for 1M Gate Array, T. Iwamatsu et al, USLI Laboratory, Mitsubishi Electric Corporation, IEEE, 1993, pp. 18.5.1–18.5.4.
Substrate–Bias Effect and Source–Drain Breakdown Characteristics in Body–Tied Short–Channel SOI MOSFET'S, Shigenobu Maeda, et al., IEEE Transactions on Electron Devices, vol. 46, No. 1, Jan., 1999, pp. 151–158.

* cited by examiner

*Primary Examiner*—Fetsum Abraham
(74) *Attorney, Agent, or Firm*—Oblon, Spivak, McClelland, Maier & Neustadt, P.C.

(57) ABSTRACT

An SOI layer is formed so thick that a body region is not fully depleted under conditions of floating and a zero potential. When a MOSFET operates, a negative body potential is applied to the body region through a body electrode. Thus, the body region is fully depleted. The MOSFET is formed equivalently to a conventional MOSFET of a PD mode as to the thickness of the SOI layer, and is equivalent to a MOSFET of an FD mode as to its operation. Therefore, both of advantages of a PD mode MOSFET such as low resistance in source/drain regions, easiness in formation of a contact hole for a main electrode and stability of a silicide layer and an advantage of an FD mode MOSFET such as excellent switching characteristics are compatibly implemented.

26 Claims, 21 Drawing Sheets

| | DEGREE OF BODY FIXATION | PARASITIC CAPACITANCE BETWEEN GATE ELECTRODE AND BODY REGION |
|---|---|---|
| MOS 50 | HIGH | LARGE |
| MOS 51 | LOW | MEDIUM |
| MOS 52, 53 | HIGH | SMALL |

151

152

TFT WITH PARTIALLY DEPLETED BODY

BACKGROUND OF THE INVENTION

1. Field of the Invention

The present invention relates to a semiconductor device having an SOI (semiconductor on insulator) MOSFET (metal oxide semiconductor field-effect transistor).

2. Description of the Background Art

FIG. 27 is a front sectional view of a conventional semiconductor device 151 forming the background of the present invention. In this semiconductor device 151, an insulator film 82 is formed on a semiconductor substrate 81, and an SOI layer 83 containing silicon as base material is formed on the insulator film 82. Namely, the semiconductor device 151 is formed as an SOI semiconductor device.

As shown in FIG. 27, an n-channel MOSFET is provided in the semiconductor device 151. An n-conductivity type source region 84, a p-conductivity type body region 86 and an n-conductivity type drain region 85 are provided in the SOI layer 83. The body region 86 is formed to be held between the source region 84 and the drain region 85. The source/drain regions 84 and 85 include n⁻-conductivity type low-concentration regions 88 and 89 and n⁺-conductivity type high-concentration regions 87 and 90 respectively.

A gate electrode 93 is opposed to the body region 86 through a gate insulator film 97. Side walls 94 are formed on side surfaces of the gate electrode 93 and the gate insulator film 97. A source electrode supplying a source potential Vs is connected to the source region 84, and a drain electrode supplying a drain potential Vd is connected to the drain region 85.

As shown in FIG. 27, a depletion layer 92 is formed in the body region 86 along p-n junctions. However, the SOI layer 83 is formed so sufficiently thick that the depletion layer 92 does not occupy the overall body region 86 but leaves a p-type semiconductor region 91 containing holes serving as carriers in a lower portion of the body region 86.

In other words, the SOI-type MOSFET provided on the semiconductor device 151 is formed as a MOSFET operating in a partially depleted mode (hereinafter referred to as a PD mode). The MOSFET operating in the PD mode has characteristics substantially equivalent to those of a bulk MOSFET since the depletion layer 92 does not reach the insulator film 82.

FIG. 28 illustrates a well-known semiconductor device 152 comprising a bulk MOSFET. This semiconductor device 152 comprises not a multilayer substrate including a semiconductor substrate 81, an insulator film 82 and an SOI layer 83, but a single semiconductor substrate 95. Source/drain regions 84 and 85 and a body region 86 are selectively formed in an upper portion of the semiconductor substrate 95.

As shown in FIG. 28, a wide p-type semiconductor region 96 containing holes is present under a depletion layer 92 in the bulk MOSFET. The bulk MOSFET is common in this point with the MOSFET operating in the PD mode, and hence the characteristics of the former are approximate to those of the latter.

In still another conventional semiconductor device 153 shown in FIG. 29, on the other hand, the thickness of an SOI layer 83 is by far smaller than that in the semiconductor device 151 shown in FIG. 27. In a MOSFET provided on the semiconductor device 153, therefore, a depletion layer 92 reaches an insulator film 82. In other words, the SOI-type MOSFET provided on the semiconductor device 153 is formed as a MOSFET operating in a fully depleted mode (hereinafter referred to as an FD mode).

The MOSFET (hereinafter also referred to as the MOSFET of the FD mode) operating in the FD mode advantageously obtains an ideal S factor dissimilarly to the MOSFET (hereinafter also referred to as the MOSFET of the PD mode) operating in the PD mode. The S factor, which is also referred to as a subthreshold coefficient, is defined as a slope S of a leading edge in a transition curve showing the relation between the logarithm of a main current Id and a gate potential Vg, as shown in FIG. 30. The transition curve more sharply rises as the S factor reduces, to provide desirable switching characteristics.

In the MOSFET of the FD mode, however, electrical resistance of the source/drain regions 84 and 85 is high due to the small thickness of the SOI layer 83, leading to inferior substantial characteristics as compared with the bulk MOSFET. In a step of forming contact holes for connecting main electrodes to the source/drain regions 84 and 85, the contact holes disadvantageously readily reach the insulator film 82 through the SOI layer 83 due to the small thickness thereof. In other words, it is difficult to connect the main electrodes to the source/drain regions 84 and 85.

When silicide layers are formed on surfaces of the source/drain regions 84 and 85 for reducing contact resistance between the source/drain regions 84 and 85 and the main electrodes, the silicide layers disadvantageously readily reach the insulator film 82 due to the small thickness of the SOI layer 83. The silicide layers are easy to separate when reaching the insulator film 82, as a matter of course.

On the other hand, the MOSFET of the PD mode having the thick SOI layer 83 causes no such problems of the MOSFET of the FD mode. However, the MOSFET of the PD mode cannot attain a small S factor advantageously obtained in the MOSFET of the FD mode. In the MOSFET of the PD mode, further, the p-type semiconductor region 91 located immediately under the depletion layer 92 is in a floating state to form an electrostatic capacitance between the p-type semiconductor region 91 and the gate electrode 93. Consequently, a gate threshold voltage disadvantageously fluctuates.

In addition, the p-type semiconductor region 91 stores holes and hence a parasitically formed npn bipolar transistor disadvantageously readily conducts. A leakage current increases following such conduction of the parasitic bipolar transistor.

SUMMARY OF THE INVENTION

A semiconductor device according to a first aspect of the present invention is provided with circuit elements in a semiconductor chip having an SOI layer, and comprises a MOSFET and a power supply part as the circuit elements. The MOSFET comprises a source region and a drain region selectively formed in the SOI layer and a body region held between the source region and the drain region, the thickness of the SOI layer is set at a value not fully depleting the body region under a floating condition and a condition supplied with the same potential as the source region, and the power supply part generates a voltage of a constant level and supplies the voltage between the source region and the body region in a direction for enlarging a depletion layer formed in the body region.

In the semiconductor device according to the first aspect of the present invention, the SOI layer is formed in a large thickness equivalently to the conventional MOSFET operating in the PD mode, whereby the resistance of the source drain and the drain region is suppressed low. Further, contact holes for connecting a main electrode to the source region and the drain region are easy to form. In addition, a semiconductor metal compound layer can be stably formed on surfaces of the source region and the drain region. Further, it is possible to drive the semiconductor device while applying a substrate bias without floating the body region or equalizing the potential thereof to that of the source region. Thus, the present invention relaxes or solves the problems of an instable gate threshold voltage and a large leakage current.

Further, no voltage for applying the substrate bias needs to be externally supplied, whereby no terminal needs to be provided for relaying the voltage for applying the substrate bias. In addition, wires in the semiconductor device can be reduced in length. Further, no specific power source needs to be prepared for using the semiconductor device, whereby the semiconductor device is convenient to use.

A semiconductor device according to a second aspect of the present invention is provided with a circuit element in a semiconductor chip having an SOI layer, and comprises a MOSFET as the circuit element. The MOSFET comprises a source region and a drain region selectively formed in the SOI layer and a body region held between the source region and the drain region, the thickness of the SOI layer is set at a value not fully depleting the body region under a floating condition and a condition supplied with the same potential as the source region, and the semiconductor device further comprises a terminal for being externally supplied with a voltage for relaying the voltage to the source region and the body region.

In the semiconductor device according to the second aspect of the present invention, the SOI layer is formed in a large thickness equivalently to the conventional MOSFET operating in the PD mode, whereby the resistance of the source drain and the drain region is suppressed low. Further, contact holes for connecting a main electrode to the source region and the drain region are easy to form. In addition, a semiconductor metal compound layer can be stably formed on surfaces of the source region and the drain region. Further, it is possible to drive the semiconductor device while applying a substrate bias without floating the body region or equalizing the potential thereof to that of the source region. Thus, the present invention relaxes or solves the problems of an instable gate threshold voltage and a large leakage current.

According to a third aspect of the present invention, the ratio L/W of the channel length L to the channel width W of the MOSFET is set smaller than a saturation start ratio.

In the semiconductor device according to the third aspect of the present invention, the ratio L/W is set smaller than the saturation start ratio, whereby the gate threshold voltage of the MOSFET is suppressed to a saturation value or below the same. Therefore, the semiconductor device can operate with a low power supply voltage. Further, it is possible to implement conversion from a PD mode to an FD mode by setting the voltage applied between the source region and the body region at the level saturating the gate threshold voltage, thereby improving the switching characteristics.

According to a fourth aspect of the present invention, the voltage is set at a level saturating a gate threshold voltage of the MOSFET.

In the semiconductor device according to the fourth aspect of the present invention, the body region is set at the level saturating the gate threshold voltage, whereby the MOSFET operates in an FD mode. Therefore, an ideal S factor is obtained to implement desirable switching characteristics. Further, the gate threshold voltage is saturated, whereby the semiconductor device can operate with a low power supply voltage. In addition, conversion from the PD mode to the FD mode is implemented by applying the voltage between the source region and the body region, whereby the gate threshold voltage is easy to set.

According to a fifth aspect of the present invention, the MOSFET further comprises a gate electrode opposed to the body region through an insulator layer and made of a mid-gap material.

In the semiconductor device according to the fifth aspect of the present invention, the gate electrode is formed by the mid-gap material, whereby the gate threshold voltage can be set relatively high. In other words, the gate threshold voltage can be pulled up to a desired level by properly selecting the mid-gap material for forming the gate electrode from various types of materials even if the gate threshold voltage is saturated. Thus, the degree of design freedom can be enlarged in relation to the gate threshold voltage.

According to a sixth aspect of the present invention, the ratio L/W of the channel length L to the channel width W of the MOSFET is set larger than a saturation start ratio.

In the semiconductor device according to the sixth aspect of the present invention, the ratio L/W is set larger than the saturation start ratio, whereby the gate threshold voltage can be increased due to a substrate bias effect.

According to a seventh aspect of the present invention, the semiconductor device further comprises a memory cell, a bit line connected to the memory cell and a sense amplifier connected to the bit line, and the MOSFET is connected to the bit line as a bit line load.

In the semiconductor device according to the seventh aspect of the present invention, the MOSFET having the gate threshold voltage increased by the substrate bias effect is employed as the bit line load, whereby the gain of the sense amplifier is improved.

A semiconductor device according to an eighth aspect of the present invention is provided with circuit elements in a semiconductor chip having an SOI layer, and comprises first and second MOSFETs and a power supply line as the circuit elements. Each of the first and second MOSFETs comprises a source region and a drain region selectively formed in the SOI layer and a body region held between the source region and the drain region, the thickness of the SOI layer is set at a value not fully depleting the body region of each of the first and second MOSFETs under a floating condition and a condition supplied with the same potential as the source region, both of the source region and the body region belonging to the first MOSFET are connected to the power supply line, the first MOSFET intervenes between the source region belonging to the second MOSFET and the power supply line, the body region belonging to the second MOSFET is connected to the power supply line, the ratio L/W of the channel length L to the channel width W of the first MOSFET is set larger than a saturation start ratio, and the ratio L/W of the channel length L to the channel width W of the second MOSFET is set smaller than a saturation start ratio.

In the semiconductor device according to the eighth aspect of the present invention, the voltage applied between the source region and the body region of the second MOSFET is higher than that in the first MOSFET. On the other hand, the ratio L/W is set larger than the saturation start ratio in the first MOSFET and smaller than the saturation start ratio in the second MOSFET respectively, whereby equality in the gate threshold voltages is improved between the first and second MOSFETs.

According to a ninth aspect of the present invention, either the channel lengths or the channel widths are set at the same value between the first and second MOSFETs.

In the semiconductor device according to the ninth aspect of the present invention, either the channel lengths or the channel widths are set at a common value while only the channel widths or the channel lengths are set at different values. Therefore, the semiconductor device is advantageously easy to design in pattern or the like.

According to a tenth aspect of the present invention, a semiconductor metal compound layer is formed on surfaces of the source region and the drain region.

In the semiconductor device according to the tenth aspect of the present invention, the semiconductor metal compound layer is formed on the surfaces of the source region and the drain region, whereby contact resistance between these regions and the main electrodes can be suppressed low. Further, the SOI layer is formed in a large thickness equivalently to the conventional MOSFET operating in the PD mode, whereby the semiconductor metal compound layer is hard to separate and stabilized.

Thus, an object of the present invention is to obtain a semiconductor device compatibly implementing the advantages of both conventional MOSFETs of the PD and FD modes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

1. Embodiment 1

First, a semiconductor device according to an embodiment 1 of the present invention is described.

<1-1. Characteristic Structure and Operation of Semiconductor Device>

Figure 1:
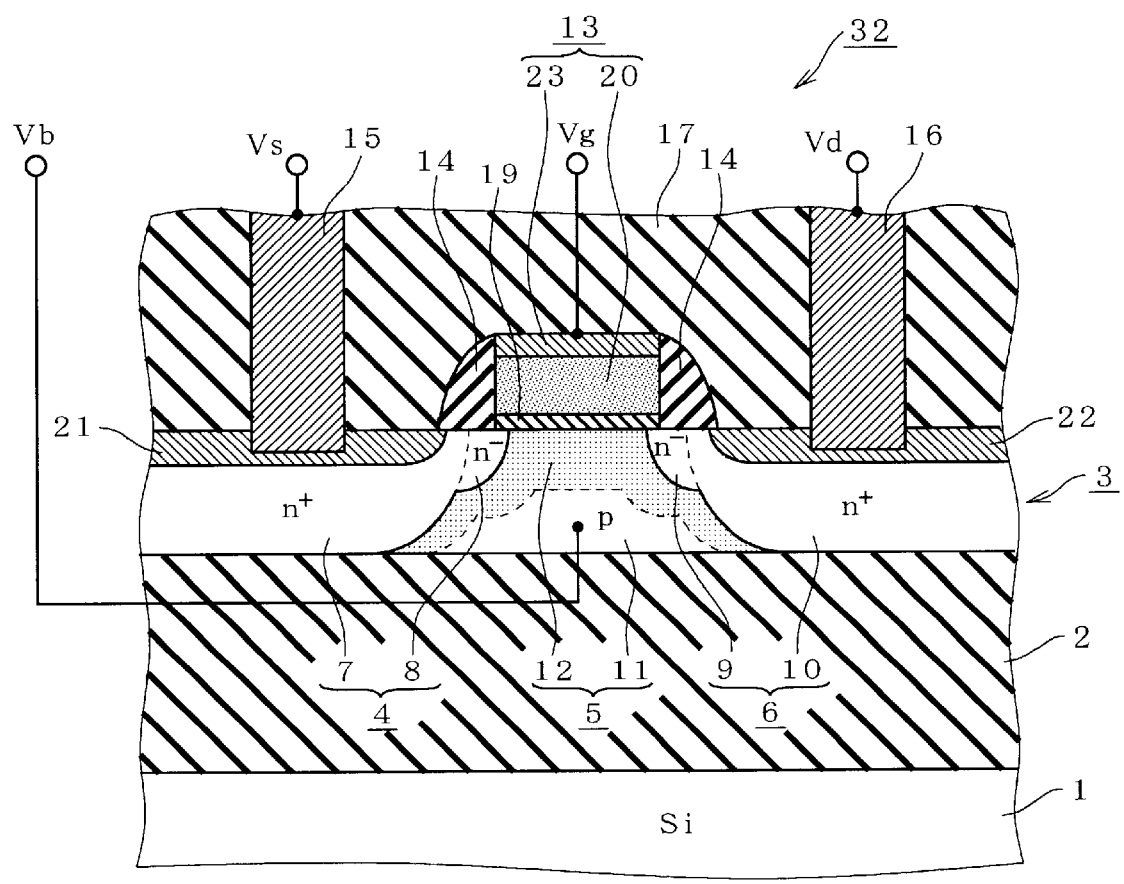
FIG. 1 is a front sectional view showing a semiconductor device according to an embodiment 1 of the present invention.

FIG. 1 is a front sectional view of a semiconductor device 30 according to the embodiment 1. In this semiconductor device 30, an insulator film 2 is formed on a semiconductor substrate 1 and an SOI layer 3 is further formed on the insulator film 2. In other words, the semiconductor device 30 is formed as an SOI semiconductor device. The semiconductor substrate 1 is a silicon substrate, for example. The insulator layer 2, which is also referred to as a buried oxide film in general, is formed as a film of a silicon oxide, for example. Further, the SOI layer 3 is formed as a silicon layer, for example.

An n-channel MOSFET 32 is built into the semiconductor device 30. In the SOI layer 3 defining upper and lower major surfaces, an n-conductivity type source region 4, a p-conductivity type body region 5 and an n-conductivity type drain region 6 are formed along the major surfaces. The body region 5 is held between the source region 4 and the drain region 6. In other words, the body region 5 is formed to isolate the source region 4 and the drain region 6 from each other.

A gate insulator film 19 is formed on a part of the upper major surface of the SOI layer 3 exposing the body region 5, i.e., an exposed surface of the body region 5, and a gate electrode 13 is formed on the gate insulator film 19. In other words, the gate electrode 13 is opposed to the exposed surface of the body region 5 through the gate insulator film 19.

Side walls 14 made of an insulator are formed on side surfaces of the gate electrode 13 and the gate insulator film 19. When the SOI layer 3 is formed as a silicon layer, the gate insulator film 19 is preferably made of a silicon oxide. The gate electrode 13 comprises a polycrystalline semiconductor layer 20 doped with an impurity. This polycrystalline semiconductor layer 20 is preferably a polysilicon layer doped with an impurity. Further, the side walls 14 are preferably made of a silicon oxide.

The source/drain regions 4 and 6 (throughout the specification, the source region 4 and the drain region 6 are generically referred to as "source/drain regions 4 and 6?") are formed in the following manner, for example: First, the SOI layer 3 is formed on the insulator film 2 as a p-conductivity type silicon substrate, and thereafter the gate insulator film 19 and the gate electrode 13 are formed on a prescribed portion of the upper major surface of the SOI layer 3.

Then, the gate electrode 13 is employed as a screen, for selectively implanting an n-type impurity such as phosphorus into the upper major surface in a low-concentration and diffusing the same. Consequently formed are $n^-$-conductivity type low-concentration regions 8 and 9. At this time, the low-concentration regions 8 and 9 are selectively exposed on the upper major surface of the SOI layer 3 to leave a p-conductivity type semiconductor region immediately under the gate electrode 13. The low-concentration regions 8 and 9 may be shallowly formed not to reach the lower major surface of the SOI layer 3, as shown in FIG. 1.

Then, the side walls 14 are formed on the side surfaces of the gate electrode 13 and the gate insulator film 19. Thereafter the gate electrode 13 and the side walls 14 are employed as screens for selectively implanting an n-type impurity such as phosphorus into the upper major surface of the SOI layer 3 in a high concentration and diffusing the same. Consequently formed are $n^+$-conductivity type high-concentration regions 7 and 10. The high-concentration regions 7 and 10 are selectively exposed on the upper major surface of the SOI layer 3, and deeply formed to reach the lower major surface of the SOI layer 3.

Consequently, a p-type semiconductor region is left under the gate electrode 13 as the body region 5. The high-concentration regions 7 and 10 are so formed that edges thereof in the upper surface of the SOI layer 3 occupy positions retreating from those of the low-concentration regions 8 and 9. In other words, p-n junctions between the body region 5 and the source/drain regions 4 and 6 are formed as those between the body region 5 and the low-concentration regions 8 and 9 at least on an upper layer part of the SOI layer 3.

In order to merely implement the essential functions of the source/drain regions 4 and 6, only the high-concentration regions 7 and 10 may be formed. However, the intensity of an electric field applied to a depletion layer formed along the p-n junctions is increased as the impurity concentration in each of the p and n layers is increased. Such an intense electric field exerts unpreferable influence on breakdown voltage of the semiconductor device or the like. When the low-concentration regions 8 and 9 are formed, on the other hand, the electric field applied to the depletion layer is weakened. No current flows in the body region 5 except an upper part thereof, and hence only the upper part may form junctions with the low-concentration regions 8 and 9.

The source/drain regions 4 and 6 and the body region 5 are formed through the aforementioned steps. Silicide layers (generally semiconductor-metal compound layers) 21 and 22 are formed on exposed surfaces of the high-concentration regions 7 and 10 covered with neither the gate insulator film 19 nor the side walls 14 in the upper major surface of the SOI layer 3. Similarly, a silicide layer (generally a semiconductor-metal compound layer) 23 is formed on the upper surface of the polycrystalline semiconductor layer 20. These silicide layers 21, 22 and 23 are formed by siliciding the exposed surfaces of the high-concentration regions 7 and 10 and the upper surface of the polycrystalline semiconductor layer 20 in a well-known manner.

Surfaces of the silicide layers 21 and 22, the gate electrode (including the polycrystalline semiconductor layer 20 and the silicide layer 23) 13 and the side walls 14 are covered with an insulator layer 17. A source electrode (main electrode) 15 and a drain electrode (main electrode) 17 are connected to the silicide layers 21 and 22 through contact holes formed in the insulator layer 17 respectively. In other words, the source/drain regions 4 and 6 are connected to the main electrodes 15 and 16 through the silicide layers 21 and 22 having low resistance respectively. Thus, contact resistance between the source/drain regions 4 and 6 and the main electrodes 15 and 16 are suppressed low.

As shown in FIG. 1, a depletion layer 12 is formed in the body region 5 along the p-n junctions. The thickness of the depletion layer 12 is large in a region adjacent to the low-concentration region 9 and small in a region adjacent to the high-concentration region 10. Whether the body region 5 is under a floating condition or supplied with the same potential as the source region 4, the depletion layer 12 does not occupy the overall body region 5 but leaves a p-type semiconductor region 11 formed with no depletion layer in a lower portion of the body region 5, i.e., in a region close to the lower major surface of the SOI layer 3.

In the semiconductor device 30, the SOI layer 3 is set at a thickness equivalent to that of the SOI layer 83 of the conventional semiconductor device 151 operating in the PD mode. In the MOSFET 32 formed in this semiconductor device 30, however, a potential different from both of a source potential Vs applied to the source electrode 15 and a drain potential Vd applied to the drain electrode 16 can be supplied to the body region 5 as a body potential Vb. In this point, the semiconductor device 30 is characteristically different from the conventional device 151.

Figure 2:
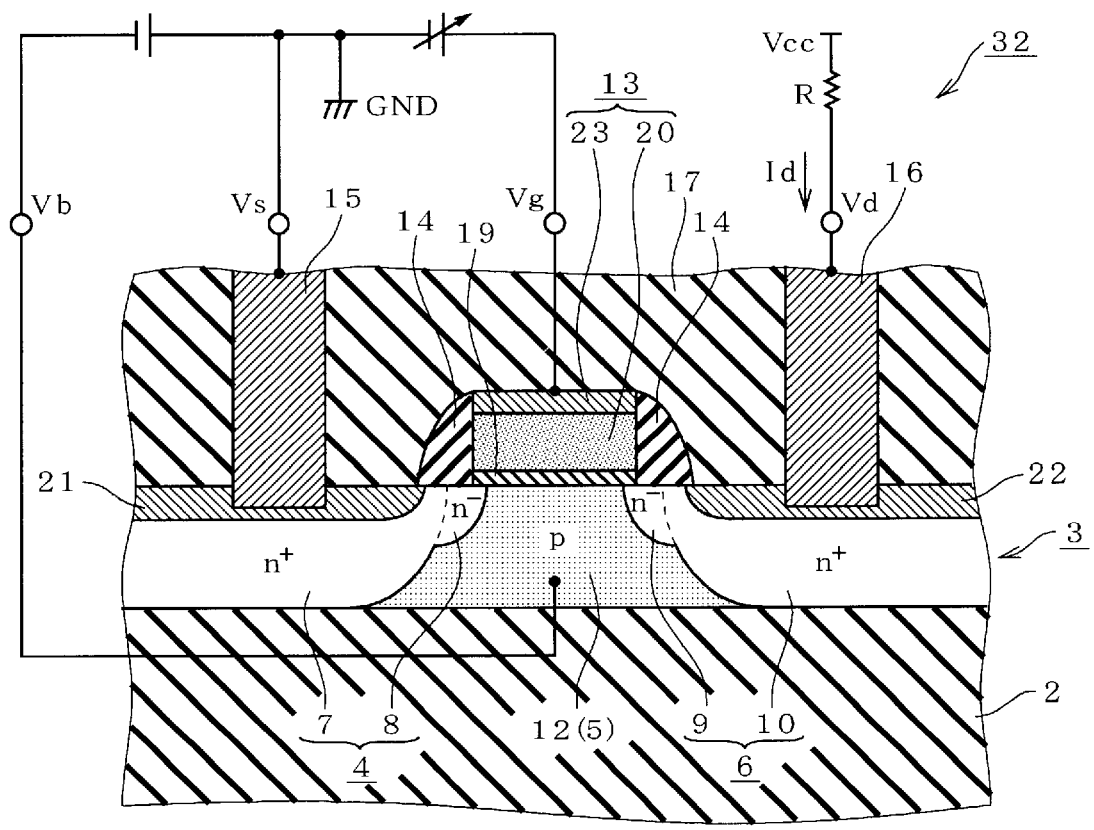
FIG. 2 illustrates operations of the semiconductor device according to the embodiment 1.

FIG. 2 illustrates exemplary relation between the potentials applied to the electrodes of the MOSFET 32. As shown in FIG. 2, a ground potential (zero potential) GND is supplied as the source potential Vs, for example. The drain electrode 16 is connected to a power supply potential Vcc through a load R, for example, whereby a potential depending on a main current (drain current) Id is applied as the drain potential Vd. A control signal is applied to the gate electrode 13 as a gate potential Vg. The load R is formed by another MOSFET, for example.

When the gate potential Vg is at a high level beyond a positive gate threshold voltage Vth specific to the MOSFET 32, an inversion layer (also referred to as a channel) is formed in the upper part of the body region 5, to feed the main current Id. In other words, the MOSFET 32 enters a conducting state. When the gate potential Vg is lower than the gate threshold voltage Vth, on the other hand, no inversion layer is formed in the body region 5 and substantially no main current Id flows. In other words, the MOSFET 32 enters a cutoff state. Thus, the level of the main current Id is controlled in response to that of the gate potential Vg in the MOSFET 32.

In the MOSFET 32, further, a negative potential sufficiently lower than the source potential Vs is supplied as the body potential Vb. In other words, a sufficiently high substrate bias is applied. Consequently, the depletion layer 12 enlarges in the body region 5 to reach the lower major surface of the SOI layer 3, thereby fully depleting the body region 5. Namely, the MOSFET 32 is equivalent to the MOSFET of the FD mode in operation. In other words, The MOSFET 32 is formed equivalently to the MOSFET of the PD mode and operates as an FD-mode MOSFET.

Thus, the MOSFET 32 operates in the FD mode, thereby obtaining an ideal S factor similarly to the conventional semiconductor device 153. In other words, the MOSFET 32 attains desirable switching characteristics. Further, no leakage current flows through the p-type semiconductor region 11 and the gate threshold voltage Vth is hard to fluctuate.

In addition, the SOI layer 3 for the MOSFET 32 is formed in a large thickness similarly to the MOSFET of the PD mode, whereby the source/drain regions 4 and 6 have low resistance to cause no deterioration of characteristics. Further, the contact holes for receiving the main electrodes 15 and 16 therein do not pass through the SOI layer 3, and excellent contact is implemented between the main electrodes 15 and 16 and the source/drain regions 4 and 6.

The SOI layer 3 is formed so thick that the silicide layers 21 and 22 can be readily formed on the exposed surfaces of the source/drain regions 4 and 6 without reaching the lower major surface of the SOI layer 3, as shown in FIGS. 1 and 2. In other words, the silicide layers 21 and 22 can be readily formed in an inseparable and stable configuration. Thus, the semiconductor device 30 solves the problems of the conventional semiconductor devices 151 and 153 while compatibly implementing the advantages thereof.

Figure 3:
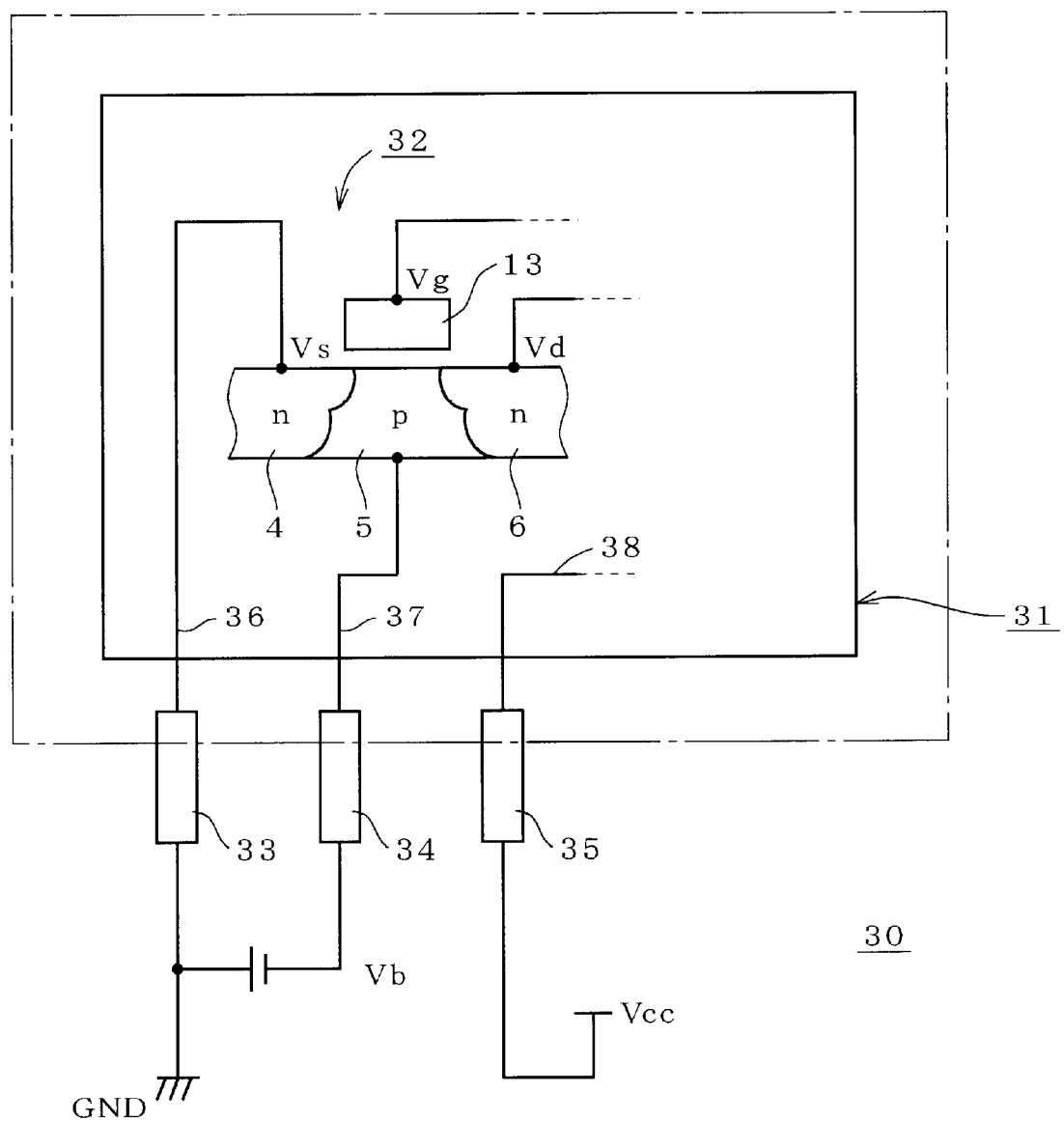
FIG. 3 schematically illustrates the overall semiconductor device according to the embodiment 1.

FIG. 3 is a schematic diagram showing the overall structure of the semiconductor device 30. The semiconductor device 30 comprises a single semiconductor chip 31 of an SOI type having the semiconductor substrate 1, the insulator film 2 and the SOI layer 3. The aforementioned MOSFET 32 is built into this semiconductor chip 31. The MOSFET 32 may be single or plural. In general, another MOSFET (not shown) is built into the same semiconductor chip 31 in addition to the MOSFET 32.

The semiconductor device 30 comprises a ground potential terminal 33 and a power supply terminal 35 for externally supplying the ground potential GND and the positive power supply potential Vcc to various elements built into the semiconductor chip 31 respectively, as well as a body potential terminal 34 for supplying the body potential Vb. When the semiconductor device 30 is used, the ground potential GND and the positive power supply potential Vcc are supplied to the ground potential terminal 33 and the power supply potential terminal 35 respectively. Further, the body potential terminal 34 is supplied with the negative body potential Vb sufficient for fully depleting the MOSFET 32. The ground potential GND, the body potential Vb and the power supply potential Vc supplied to the terminals 33, 34 and 35 are transmitted to the various elements built into the semiconductor chip 31 through wires 36, 37 and 38 respectively.

<1-2. Device Provided with Power Source>

Figure 4:
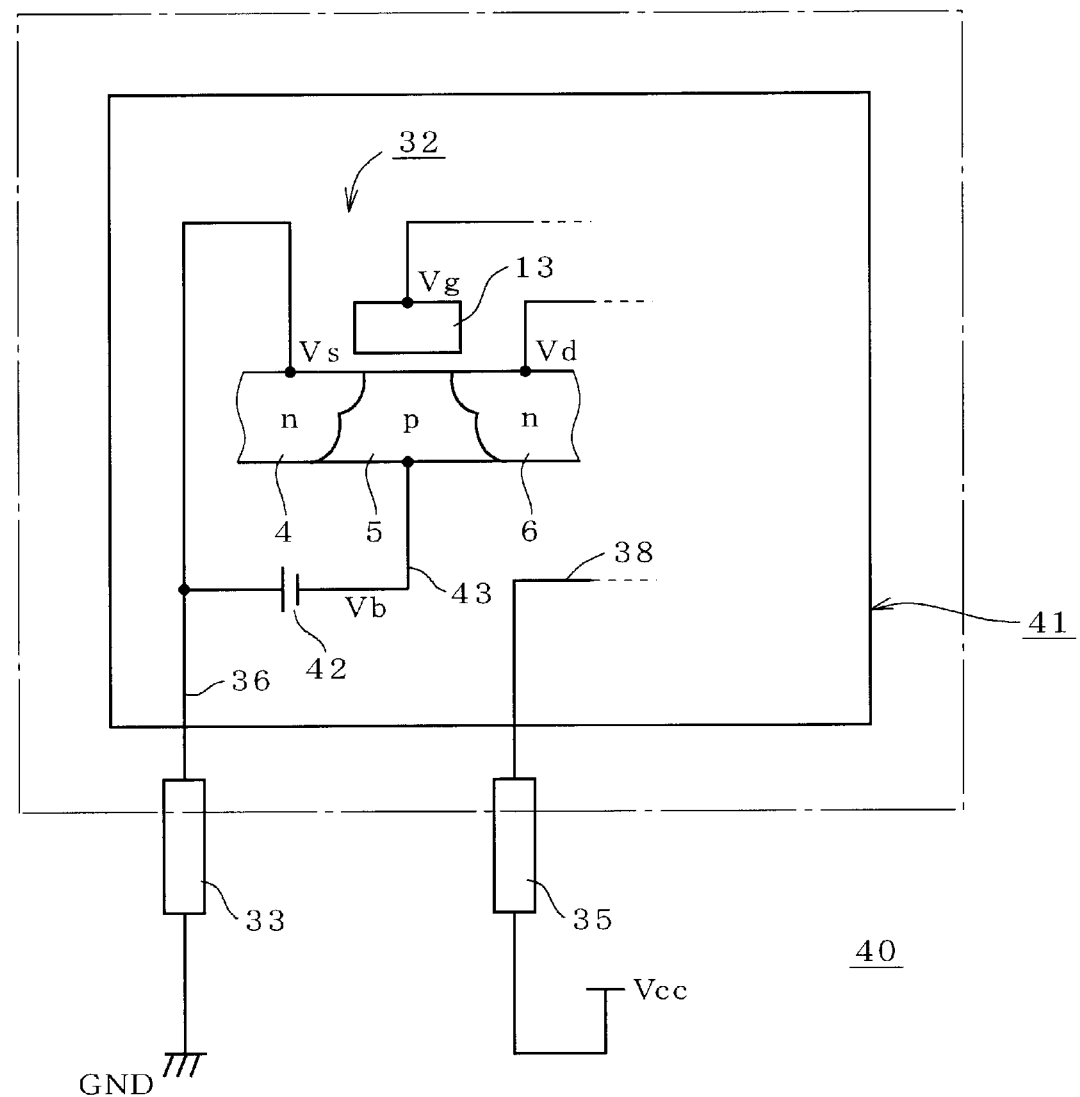
FIG. 4 schematically illustrates the overall structure of another semiconductor device according to the embodiment 1.

The semiconductor device 30 is so formed that the body potential Vb can be externally supplied. When a power supply part for supplying the body potential Vb, which is negative with reference to the source potential Vs, sufficiently large for fully depleting the MOSFET 32 to the MOSFET 32 is built into the semiconductor chip 31, however, the body potential terminal 34 can be removed. FIG. 4 is a schematic diagram showing a semiconductor device 40 having such a structure.

In the semiconductor device 40 shown in FIG. 4, an SOI semiconductor chip 41 comprises a power supply part 42 in addition to a MOSFET 32. The power supply part 42 supplies the MOSFET 32 with a body potential Vb sufficiently lower than a source potential Vs for fully depleting the MOSFET 32. The power supply part 42 is supplied with a ground potential GND and a power supply potential Vcc, and generates the negative body potential Vb lower than the ground potential GND on the basis of the difference between the potentials GND and Vcc. The power supply part 42 transmits the generated body potential Vb to the MOSFET 32 through a wire 43.

Thus, the semiconductor device 40 comprises the power supply part 42 for supplying the body potential Vb, whereby the body potential Vb may not be externally supplied. Therefore, the body potential terminal 34 (FIG. 3) can be removed and the wire 37 (FIG. 3) is replaced with the shorter wire 43. As understood from that a DRAM generally comprises a power supply part, it is not technically difficult to provide the power supply part 42 in the semiconductor device 40.

<1-3. Shape of Body Region>

FIGS. 5 to 8 show exemplary shapes of the body region. In a MOSFET 50 included in a semiconductor device shown in FIG. 5, a body region 5 and body regions 54 are integrated with each other to have an H-shaped plane. A gate electrode 13 is opposed to both of the body regions 5 and 54 through gate insulator films 19.

The body regions 54 are simultaneously formed with the body region 5 when source/drain regions 4 and 6 are selectively formed on an SOI layer 3. In the integrated body region having the H-shaped plane, the body region 5 corresponds to a region held between the source and drain regions 4 and 6 with an inversion layer to be formed in an upper part thereof. The body regions 54 correspond to regions not held between the source and drain regions 4 and 6. Therefore, no inversion layers are formed on the body regions 54.

P+-conductivity type body contact regions 45 are formed to be adjacent to the body regions 54. Body electrodes 46 are connected to these body contact regions 45 through contact holes formed in an insulator layer 17 (not shown). A body potential Vb is transmitted to the body region 5 through the body electrodes 46, the body contact regions 45 and the body regions 54.

Figure 5:
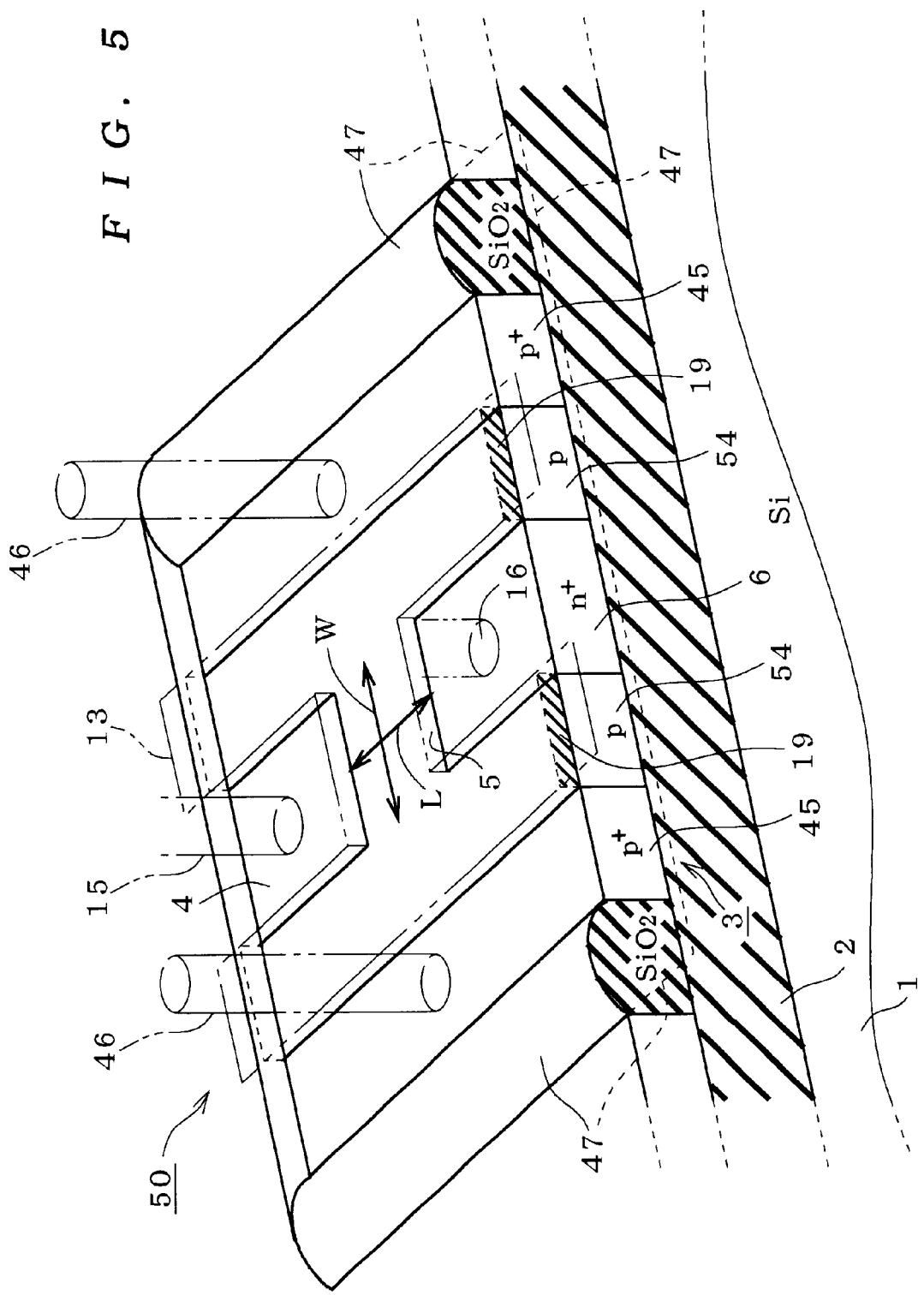
FIG. 5 is a perspective view showing an exemplary body region according to the embodiment 1.

Isolation insulator layers 47 are formed around the MOSFET 50. These isolation insulator layers 47 electrically isolate the MOSFET 50 from other elements formed in external regions. The isolation insulator layers 47 are made of a silicon oxide, for example. Referring to FIG. 5, symbols L and W denote the length of the body region 5, i.e., a channel length, and the width of the body region 5, i.e., a channel width respectively. Optimum ranges for the channel length L and the channel width W are described later.

Figure 6:
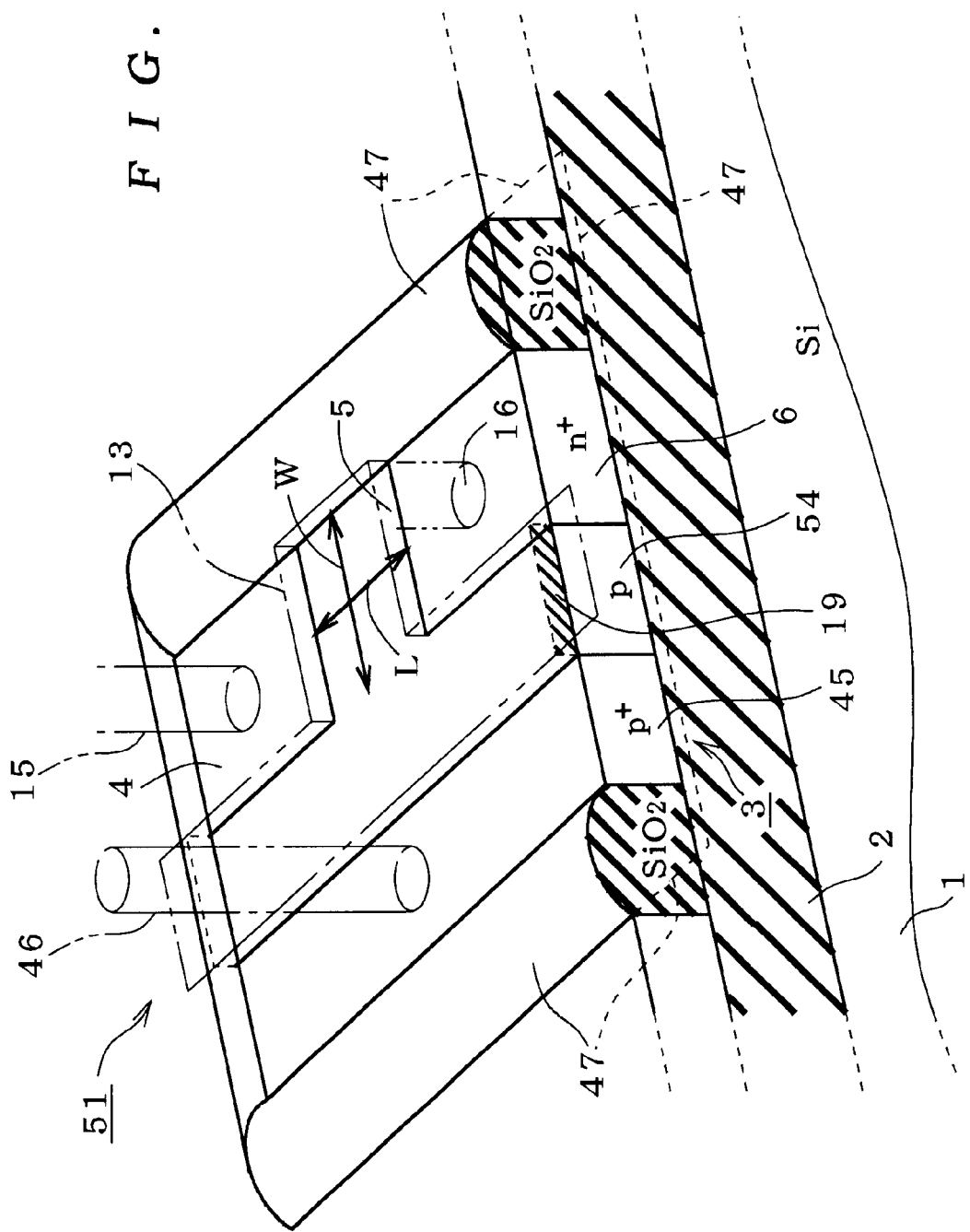
FIG. 6 is a perspective view showing another exemplary body region according to the embodiment 1.

In a MOSFET 51 included in a semiconductor device shown in FIG. 6, a body region 5 and a body region 54 are integrated with each other to have a T-shaped plane. Also in the MOSFET 51, a gate electrode 13 is opposed to both of the body regions 5 and 54 through a gate insulator film 19. A body contact region 45 for connecting a body electrode 46 is formed adjacently to the body region 54. Further, isolation insulator layers 47 are formed around the MOSFET 51.

Figure 7:
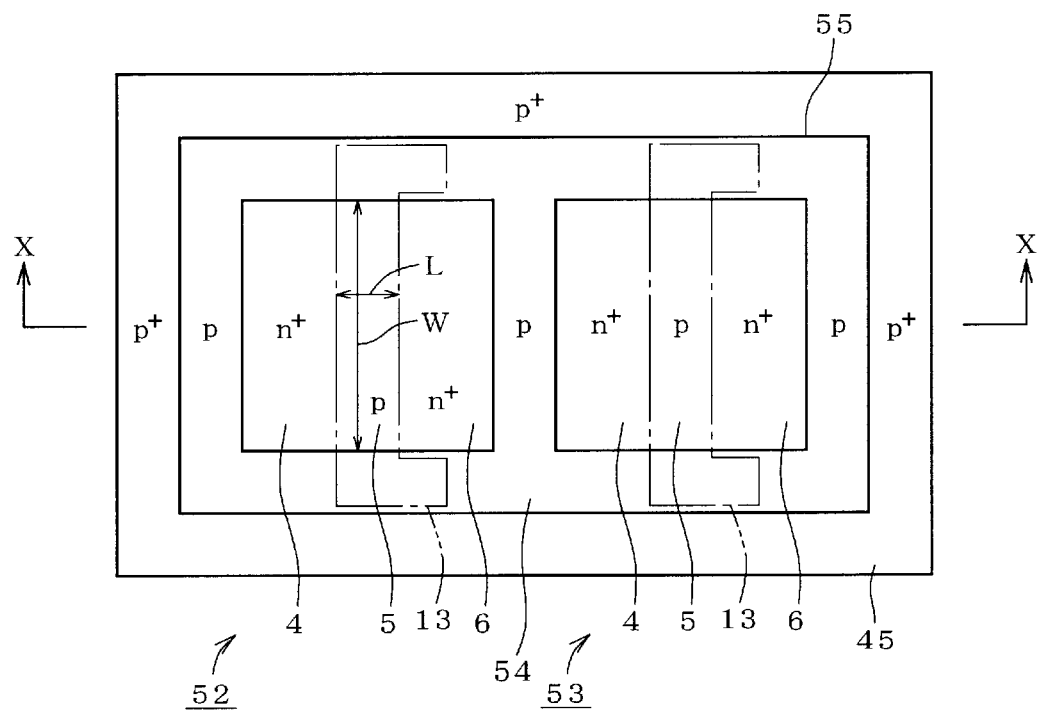
FIG. 7 is a perspective view showing still another exemplary body region according to the embodiment 1.
Figure 8:
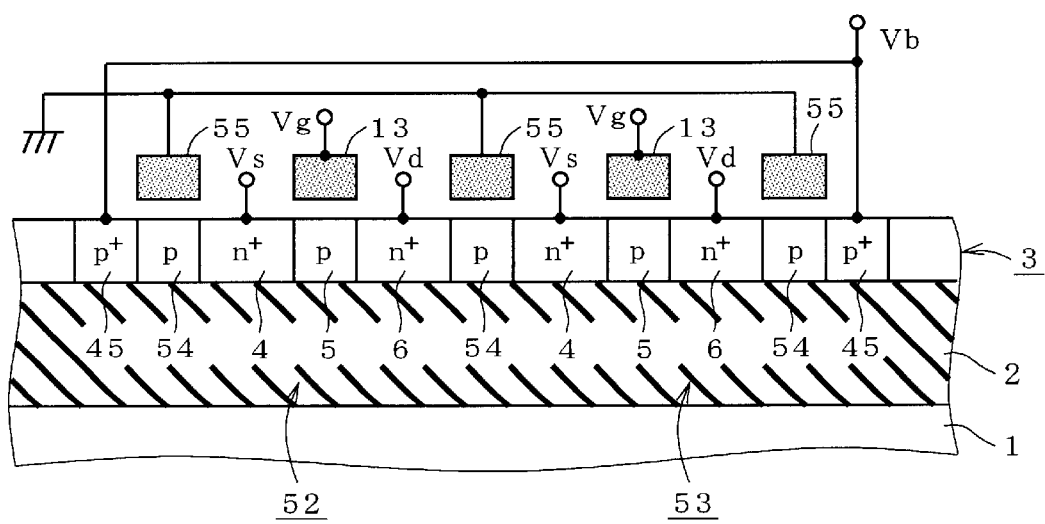
FIG. 8 is a sectional view taken along the line X—X in FIG. 7.

In a semiconductor device shown in FIGS. 7 and 8, two MOSFETs 52 and 53 are formed adjacently to each other. FIG. 7 is a plan sectional view, and FIG. 8 is a sectional view taken along the line X—X in FIG. 7. In each of the MOSFETs 52 and 53, a body region 54 is annularly formed to be integrally connected with both ends of a body region 5 along the direction of its channel width W and enclose source/drain regions 4 and 6. Such annular body regions 54 of the adjacent MOSFETs 52 and 53 are adjacent to each other to be integrally coupled with each other.

A body contact region 45 is annularly formed to enclose both of the body regions 54 belonging to the MOSFETs 52 and 53 respectively. Therefore, a body potential Vb supplied to the body contact region 45 is transmitted to the body regions 54 and the body regions 5 of the MOSFETs 52 and 53 in common. In other words, the body potential Vb is common to the MOSFETs 52 and 53 in this semiconductor device.

In this semiconductor device, gate electrodes 13 are formed to cover overall exposed surfaces of body regions 5 and parts of those of the body regions 54, and field electrodes 55, provided independently of the gate electrodes 13, are formed to cover the overall exposed surfaces of the body regions 54. The field electrodes 55 are opposed to the exposed surfaces of the body regions 54 through insulator films (not shown).

As shown in FIG. 8, a ground potential GND is supplied to the field electrodes 55. Thus, the MOSFETs 52 and 53 are electrically isolated from other elements (not shown) formed around the same. In other words, the semiconductor device shown in FIGS. 7 and 8 attains element isolation by the field electrodes 55 in place of the isolation insulator layers 47 (FIGS. 5 and 6). The semiconductor device shown in FIGS. 7 and 8 employing field shield isolation can improve the degree of integration of elements as compared with the semiconductor devices shown in FIGS. 5 and 6 employing insulator layer isolation.

Figures 9, 10:
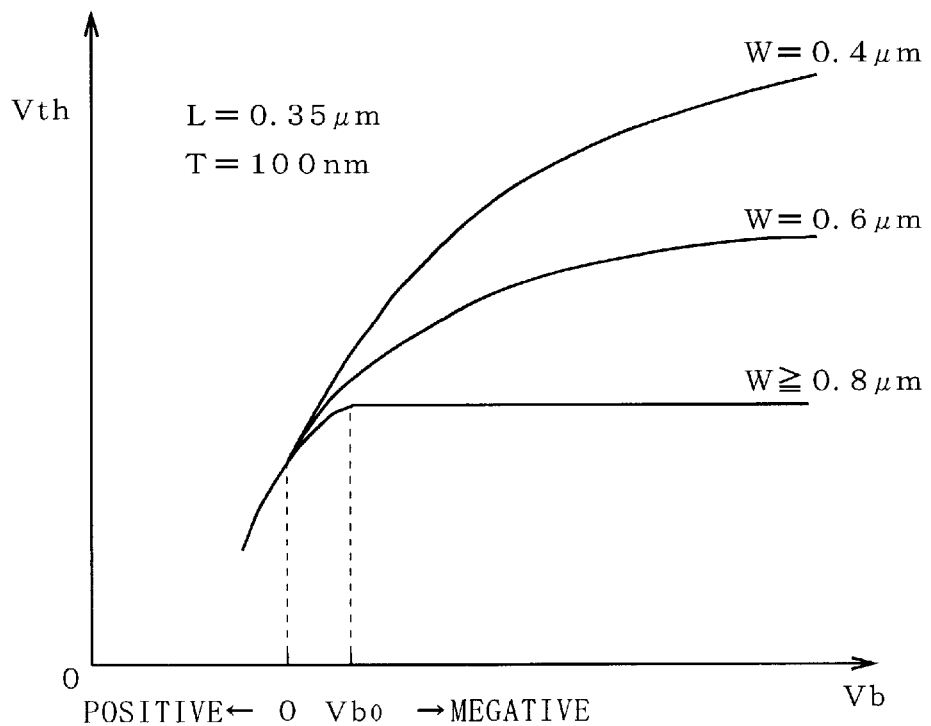
FIG. 9 is an explanatory diagram in the form of a table showing the characteristics of the semiconductor devices shown in FIGS. 5 to 8 in comparison with each other.
FIG. 10 is a graph showing results of an experiment in relation to Vth vs. Vb characteristics.

FIG. 9 is an explanatory diagram showing the characteristics of the three semiconductor devices shown in FIGS. 5 to 8 in comparison with each other in the form of a table. "Degree of body fixation", indicating how the potential at which the overall body region 5 is fixed is close to the body potential Vb on the average, depends on electrical resistance along a path between the body contact region 45 and the body region 5 through the body region(s) 54. The potential at which the body region 5 is fixed approximates the body potential Vb as the electrical resistance is reduced.

In each of the MOSFET 50 (FIG. 5) and the MOSFETs 52 and 53 (FIGS. 7 and 8), the degree of body fixation is higher since both end portions of the body region 5 along the channel width W is connected to the body region(s) 54. In the MOSFET 51 (FIG. 6), on the other hand, the degree of body fixation is lower since only one end of the body region 5 along the channel width W is connected to the body region 54.

The parasitic capacitance between the gate electrode 13 and the body regions 5 and 54 increases as the opposite area therebetween increases. Thus, the parasitic capacitance in the MOSFET 50 (FIG. 5) is at the maximum and that of the MOSFET 51 (FIG. 6) is at a smaller value. In each of the MOSFETs 52 and 53 (FIGS. 7 and 8), the gate electrode 13 merely covers the body region 5 and a part of the body region 54 while the field electrode 55 is positioned between the gate electrode 13 and the body region 54. Therefore, the parasitic capacitance between the gate electrode 13 and the body regions 5 and 54 is smaller than that in the MOSFET 51.

<1-4. Optimum Range of Channel Width W>

FIG. 10 is a graph showing the relation between the gate threshold voltage Vth and the body potential Vb with reference to various channel widths W. This graph shows results of verification made by setting the channel length L and the thickness T of the SOI layer 3 at 0.35 $\mu$m and 100 nm respectively and confirmed through experiments and simulations.

As shown in FIG. 10, the gate threshold voltage Vth increases as the body potential Vb increases in the negative direction. When the channel width W is in excess of a certain reference width (hereinafter referred to as "saturation start width", which is 0.8 $\mu$m in this example), however, the gate threshold voltage Vth remains substantially constant and does not conspicuously increase even if the body potential Vb increases in the negative direction beyond a certain reference body potential $Vb_0$ (<0).

Namely, saturation appears in the relation between the gate threshold voltage Vth and the body potential Vb when the channel width W is in excess of the saturation start width. This is because the depletion layer 12 enlarges as the body potential Vb increases in the negative direction such that the depletion layer 12 reaches the insulator film 12 to fully deplete the body region 5 when the channel width W is in excess of the saturation start width and the body potential Vb exceeds the reference body potential Vb0, in particular. In other words, a saturated state of the gate threshold voltage Vth corresponds to the FD mode.

If the channel width W is smaller than the saturation start width (0.8 $\mu$m), on the other hand, no saturation appears but the gate threshold voltage Vth continuously increases if the body potential Vb increases in the negative direction. This phenomenon is referred to as a substrate bias effect. This means that the depletion layer 12 does not reach the insulator film 2 although the same continuously enlarges when the channel width W is smaller than the saturation start width (0.8 $\mu$m) even if the body potential Vb increases in the negative direction, and hence no transition from the PD mode to the FD mode takes place. The saturation start width (0.8 $\mu$m) generally depends on the thickness T and the channel length L. General relation between these variables is described later.

As hereinabove described, the channel width W must be set at a value larger than the saturation start width, which is a reference width decided through the thickness T and the channel length L. In addition, the body potential Vb must be set at a value larger than the reference body potential Vb0 (<0) in the negative direction. When the V.

When the channel width W is set at a value larger than the saturation start width, the FD mode can be implemented while the gate threshold voltage Vth can be suppressed low by suppressing appearance of the substrate bias effect. In other words, a semiconductor device operating with a low voltage is readily implemented. Further, high breakdown voltage can also be attained due to the FD mode operation of the semiconductor device.

In addition, the impurity concentration of the SOI layer 3 is set at a high level to some extent in the MOSFET according to the embodiment 1 of the present invention, similarly to the conventional semiconductor device 153 operating in the PD mode. In operation, the MOSFET is converted to a state operable in the FD mode due to application of the body potential Vb exceeding the reference body potential Vb0. Thus, there is no apprehension that the gate threshold voltage Vth excessively reduces but the gate threshold voltage Vth is easy to set. This is described in relation to an embodiment 2 of the present invention.

<1-5. Exemplary PMOSFET>

While the above description has been made with reference to an n-channel MOSFET, the MOSFET formed in the semiconductor device according to this embodiment may be of a p-channel type, in place of the n-channel type. In such a p-channel MOSFET, conductivity types of respective semiconductor regions and potentials applied to respective electrodes may be symmetrized with respect to the n-channel MOSFET.

Figure 11:
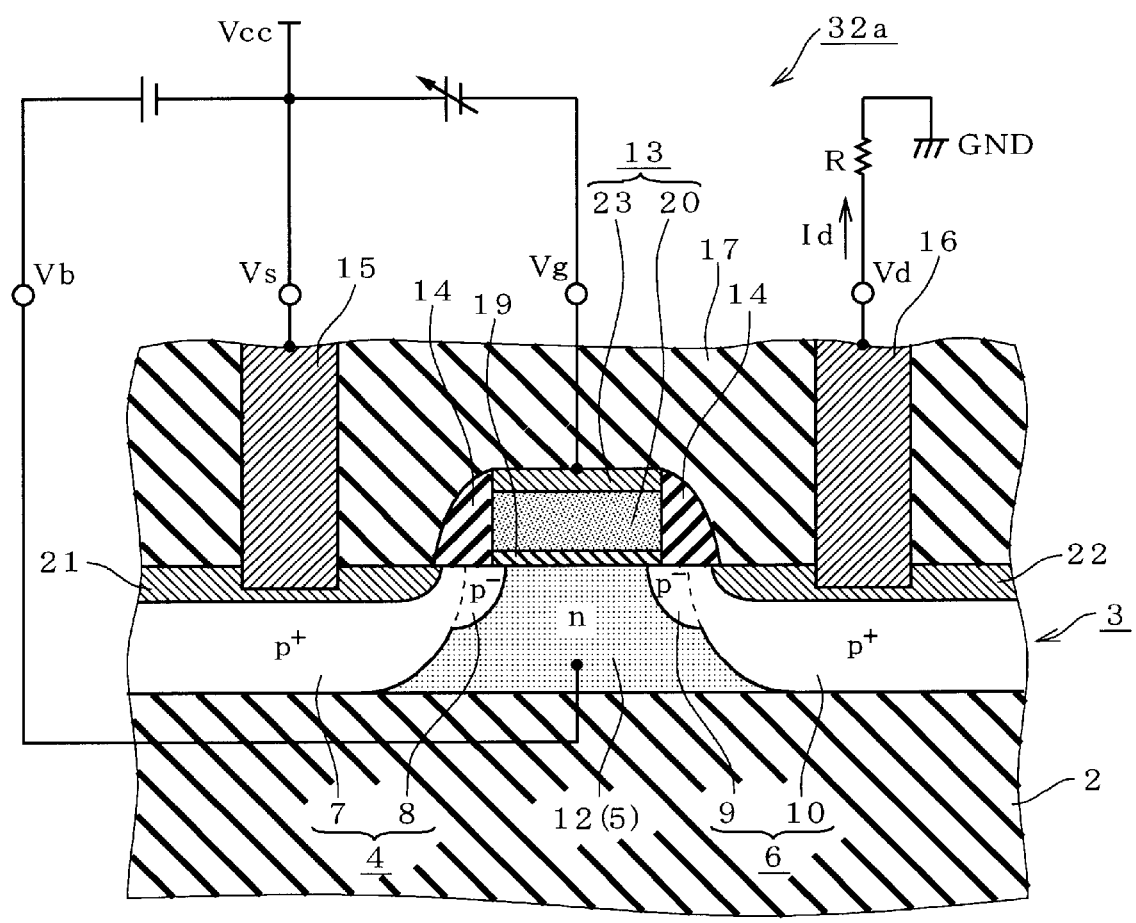
FIG. 11 is a front sectional view showing other conductivity types of the semiconductor device according to the embodiment 1.
Figure 12:
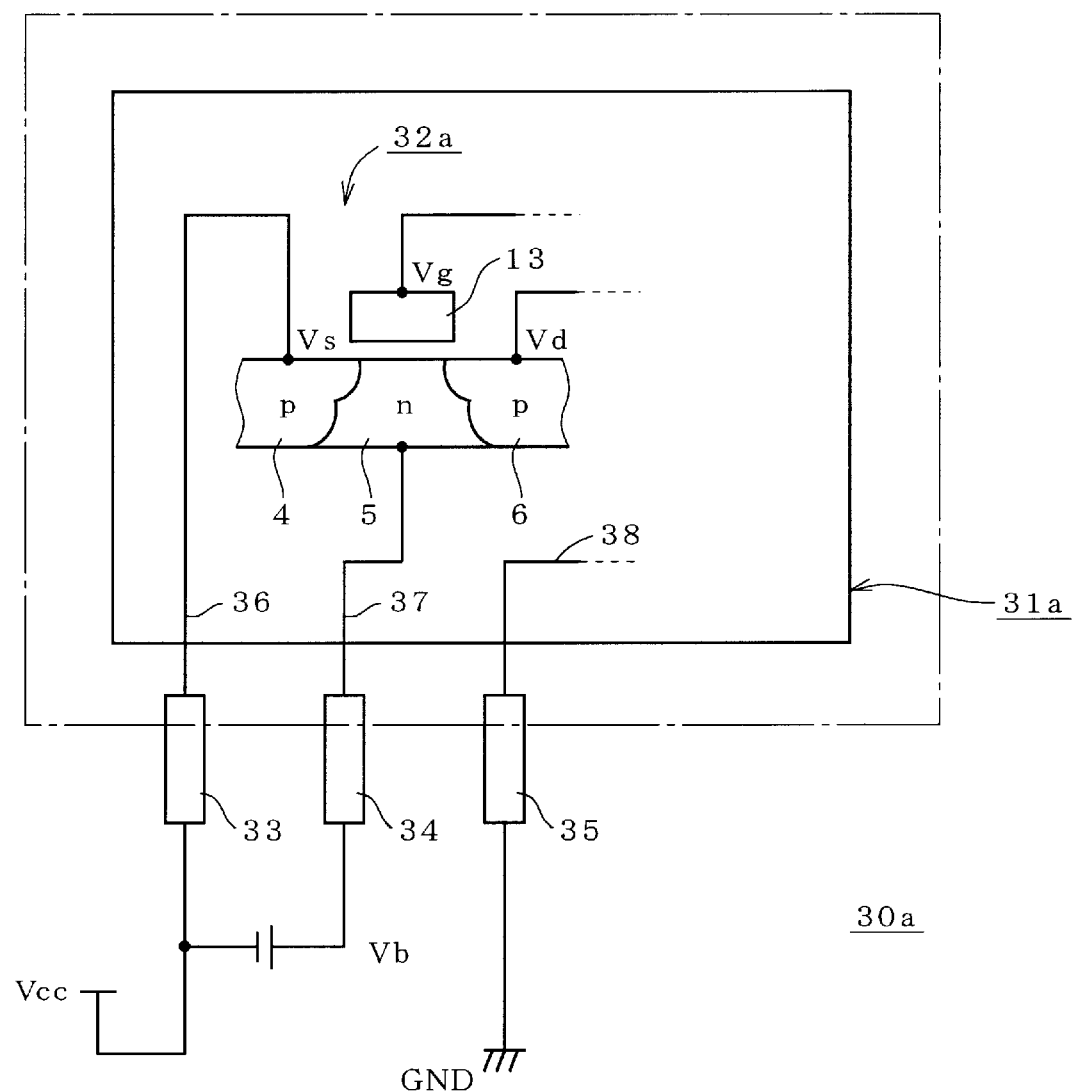
FIG. 12 schematically illustrates other conductivity types of the semiconductor device according to the embodiment 1.
Figure 13:
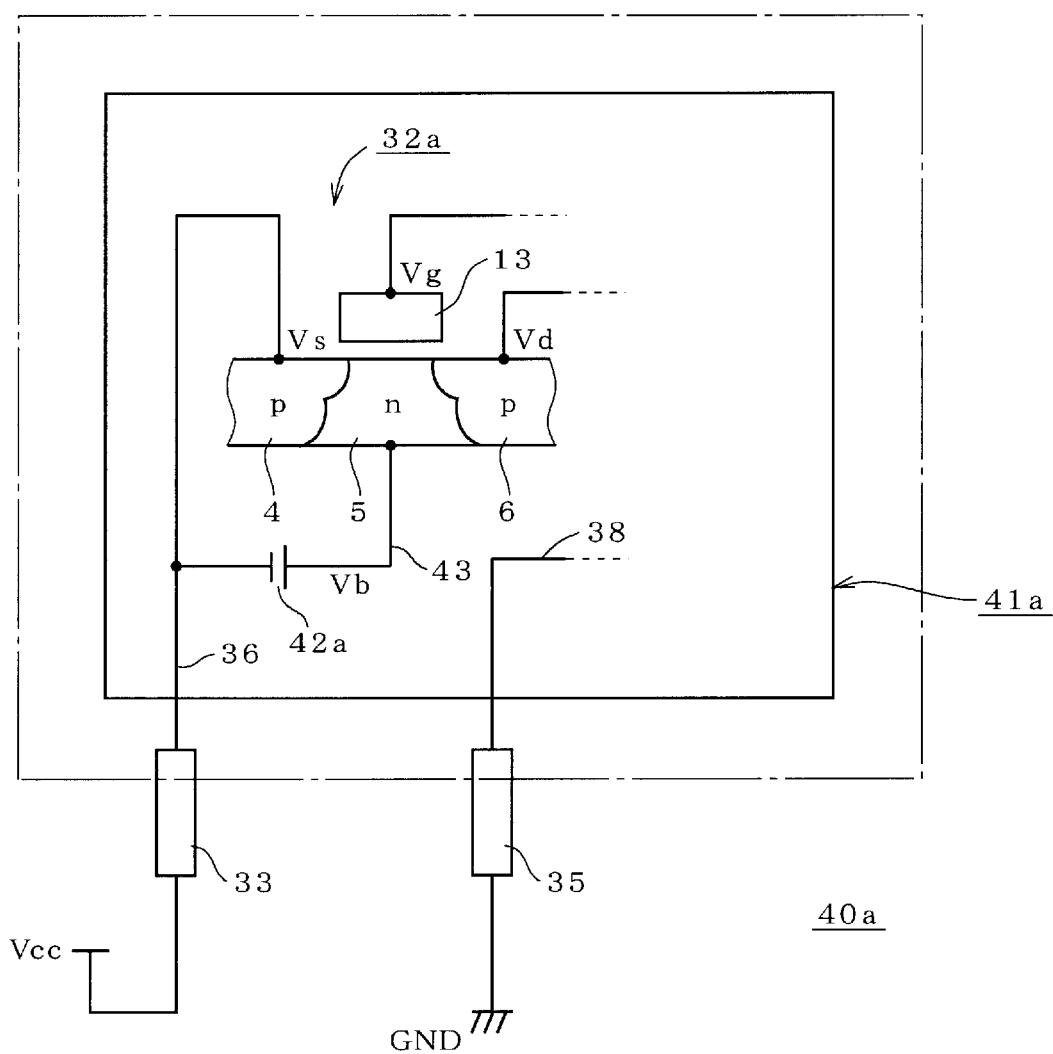
FIG. 13 schematically illustrates other conductivity types of the semiconductor device according to the embodiment 1.

FIGS. 11 to 13 show PMOSFETs (p-channel MOSFETs) corresponding to the NMOSFETs (n-channel MOSFETs) shown in FIGS. 2 to 4 respectively. Referring to FIGS. 11 to 13, parts identical or corresponding to (having the same functions as) those of the semiconductor devices shown in FIGS. 2 to 4 are denoted by the same reference numerals, to omit redundant description. Referring to FIG. 11 showing a front sectional view, a body region 5 is formed as an n-conductivity type semiconductor region and source/drain regions 4 and 6 are formed as p-conductivity type semiconductor regions in a p-channel MOSFET 32a included in a semiconductor device 30a. High-concentration regions 7 and 10 belonging to the source/drain regions 4 and 6 are formed as $p^+$-conductivity type semiconductor regions, and low-concentration regions 8 and 9 are formed as $p^-$-conductivity type semiconductor regions.

A potential lower than a source potential Vs is supplied as a drain potential Vd. Further, a body potential Vb is set at a value higher than a reference body potential Vb0 (>Vcc), whereby a depletion layer 12 of the body region 5 reaches a lower major surface of an SOI layer 3 to implement an FD mode, as shown in FIG. 11.

When a gate potential Vg drops beyond a value lower than a power supply potential Vcc by a gate threshold voltage Vth, an inversion layer is formed on the body region 5. Throughout the specification, the gate threshold voltage Vth is based on the source potential Vs, and as to the sign therefor, a positive voltage is regarded as positive in the n-channel MOSFET while a negative voltage direction is regarded as positive in a p-channel MOSFET. In both of n-channel and p-channel MOSFETs, therefore, the expression "the gate threshold voltage Vth is high" corresponds to such a state that an inversion layer is hard to form.

As shown in FIG. 12, the semiconductor device 30a is provided with a body potential terminal 34 for externally supplying the body potential Vb, similarly to the semiconductor device 30. As compared with the semiconductor device 30, the functions of a ground potential terminal 33 and a power supply potential terminal 35 are opposed to each other, such that the terminal 33 is supplied with the power supply potential Vcc and the terminal 35 is supplied with the ground potential GND. In other words, the terminal 33 is a power supply potential terminal and the terminal 35 is a ground potential terminal in the semiconductor device 30a. The body potential terminal 34 is supplied with the body potential Vb which is higher than the reference body potential Vb0 (>Vcc). Consequently, the p-channel MOSFET 32a operates in the FD mode.

A semiconductor device 40a shown in FIG. 13 stores a power supply part, similarly to the semiconductor device 40 shown in FIG. 4. In other words, a semiconductor chip 41a comprises a power supply part 42a. The power supply part 42a is supplied with a ground potential GND and a power supply potential Vcc, and generates a body potential Vb which is higher than a reference body potential Vb0 (>Vcc). The generated body potential Vb is transmitted from the power supply part 42a to a MOSFET 32a through a wire 43.

As hereinabove described, this embodiment is applicable to both of a semiconductor device having an NMOSFET and a semiconductor device having a PMOSFET. It is possible to drive each of the NMOSFET and the PMOSFET in the FD mode by supplying a sufficient potential in a direction for enlarging the depletion layer 12 as the body potential Vb. In relation to supply of the prescribed potential Vb, it is both effective to externally apply the body potential Vb through the body potential terminal 34, and to store a power supply part for generating the body potential Vb in the semiconductor device.

<1-6. Example Provided with No Silicide Layer>

In the semiconductor device according to this embodiment, the SOI layer 3 is thickly formed similarly to the conventional semiconductor device operating in the PD mode. As already described, therefore, the silicide layers 21 and 22 can be stably formed on the surfaces of the source/drain regions 4 and 6, thereby advantageously suppressing contact resistance between the source/drain regions 4 and 6 and the main electrodes 15 and 16. Further, the silicide layer 23 can be simultaneously formed on the surface of the gate electrode 13 in the process of forming the silicide layers 21 and 22 as illustrated in FIG. 1, thereby advantageously suppressing wiring resistance of the gate electrode 13.

Figure 14:
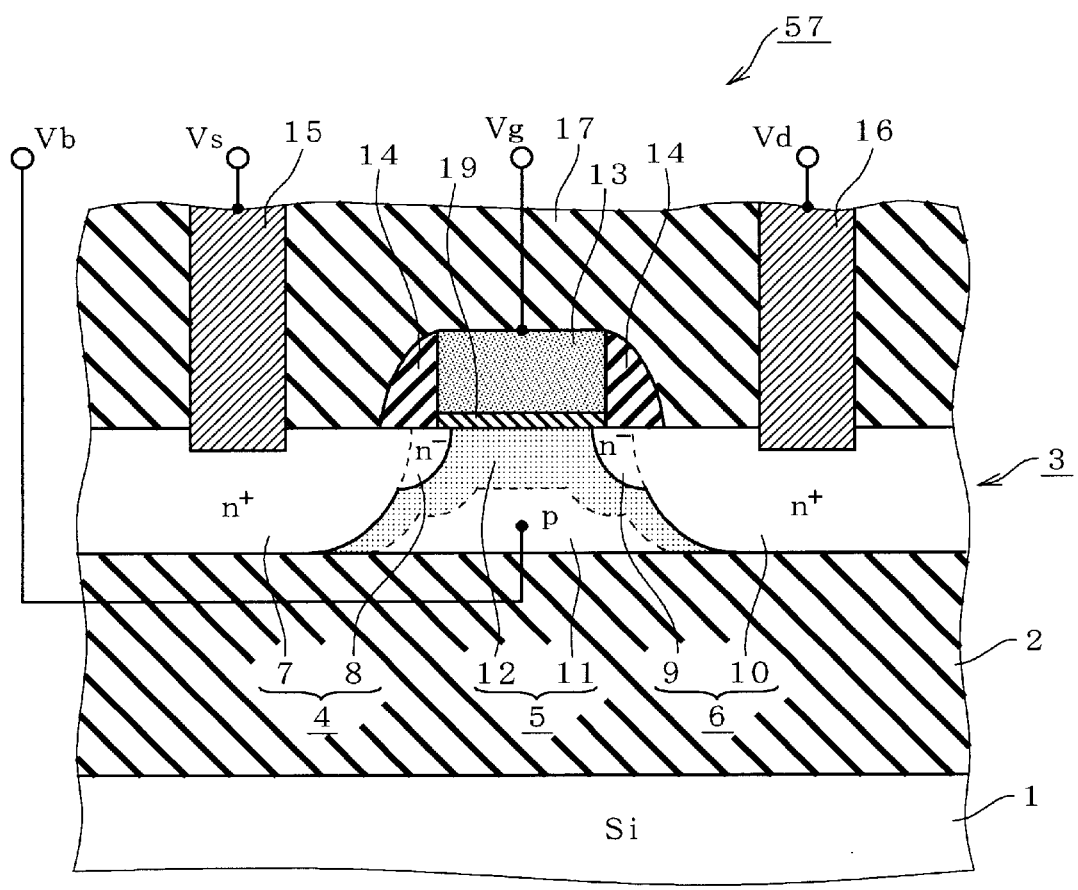
FIG. 14 is a front sectional view showing other exemplary source/drain regions according to the embodiment 1.

However, a semiconductor device 56 according to this embodiment may also have no silicide layers 21, 22 and 23, as illustrated in FIG. 14. A MOSFET 57 provided in the semiconductor device 56 shown in FIG. 14 has neither silicide layers 21 and 22 nor silicide layer 23. Source/drain regions 4 and 6 are directly connected to main electrodes 15 and 16 respectively.

In the MOSFET 57 provided with no silicide layers 21 and 22, contact resistance between the source/drain regions 4 and 6 and the main electrodes 15 and 16 is higher than the same in the MOSFET 32 or the like. Also in the MOSFET 57, however, an SOI layer 3 is thickly formed similarly to the conventional semiconductor device 151 operating in the PD mode, whereby the source/drain regions 4 and 6 have low resistance to cause no deterioration of the characteristics.

Further, the MOSFET 57 operates in the FD mode, thereby obtaining an ideal S factor, similarly to the conventional semiconductor device 153. In other words, desirable switching characteristics can be obtained. Further, no leakage current flows through a p-type semiconductor region 11.

2. Embodiment 2

Figures 15, 16:
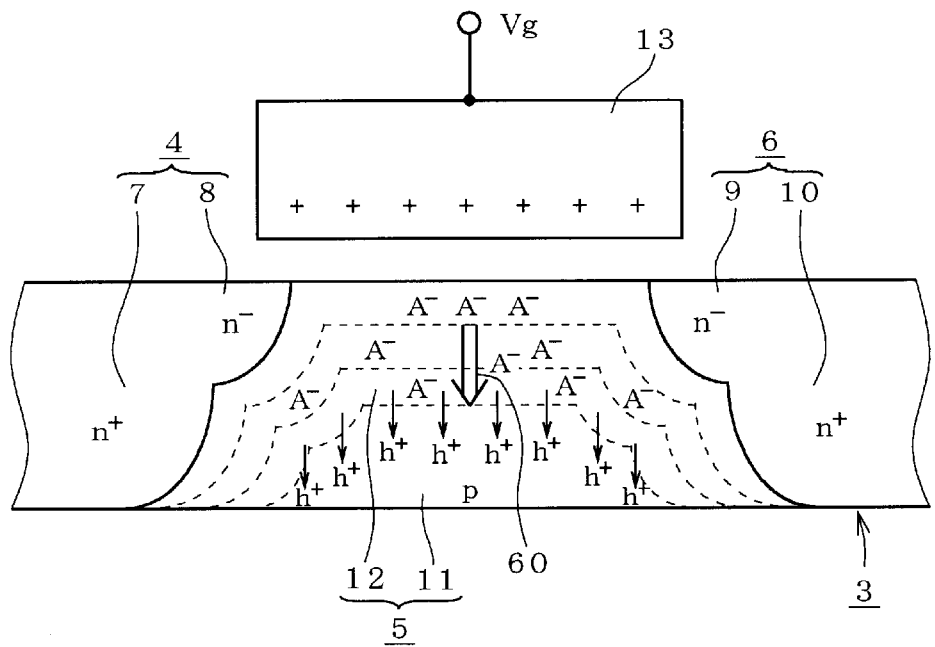
FIG. 15 is an explanatory diagram showing the background of a semiconductor device according to an embodiment 2 of the present invention.
FIG. 16 is an explanatory diagram showing the background of the semiconductor device according to the embodiment 2 of the present invention.

FIGS. 15 and 16 are explanatory diagrams showing the background of an embodiment 2 of the present invention. As shown in FIG. 15, a depletion layer 12 enlarges as a gate potential Vg applied to a gate electrode 13 increases. In other words, the front of the depletion layer 12 moves along arrow 60 to separate from the gate electrode 13. This is because holes $h^+$ in a p-type semiconductor region 11 must separate from the gate electrode 13 thereby facilitating appearance of a large number of space charges created by negative ions $A^-$ of acceptors, in order to cancel an electric field formed by the gate potential Vg to act on the holes $h^+$.

When the gate potential Vg increases beyond a gate threshold voltage Vth, however, an inversion layer (channel) 61 appears in an upper part of a body region 5 opposed to the gate electrode 13, as shown in FIG. 16. Since electrons serving as carriers appear in the inversion layer 61, the gate electrode 13 and the inversion layer 61 form a capacitor. Consequently, the electrons in the inversion layer 61 block the electric field generated by the gate potential Vg, whereby the depletion layer 12 does not enlarge even if the gate potential Vg further increases.

The maximum depletion layer width xdm expressing the maximum amount of spreading of the depletion layer 12 is a function of the concentration NA of the acceptors. The maximum depletion layer width xdm reduces as the concentration NA increases. In order to drive a MOSFET in an FD mode, the maximum depletion layer width xdm must be greater than a thickness T×dm>T). This is equivalent to such a state that the concentration NA is less than a prescribed reference concentration NA0 (NA<NA0).

On the other hand, the gate threshold voltage Vth is also a function of the concentration NA, and increases as the concentration NA increases. In order to suppress a small main current flowing when the MOSFET is in a cutoff state, i.e., a leakage current, the gate threshold voltage Vth must be greater than a prescribed reference threshold voltage Vth0 (Vth>Vth0). This is equivalent to such a state that the concentration NA is greater than another prescribed reference concentration NA1 (NA>NA1).

It is uneasy to set the concentration NA to be less than the reference concentration NA0 (NA<NA0) and greater than the reference concentration NA1 (NA>NA1). In other words, the gate threshold voltage Vth is generally uneasy to set in the MOSFET operating in the FD mode, as well known in the art. Particularly in an NMOSFET having a gate electrode 13 of polysilicon doped with an $n^+$-conductivity type impurity or a PMOSFET having a gate electrode 13 of polysilicon doped with a $p^+$-conductivity type impurity, the gate threshold voltage Vth may be excessively reduced to zero or a negative value as the case may be, if the impurity concentration of an SOI layer 3 is suppressed for implementing the FD mode.

On the other hand, the MOSFET described with reference to the embodiment 1 is formed as that operable in the PD mode by increasing the impurity concentration of the SOI layer 3, and shifted to a state operable in the FD mode in operation due to application of the body potential Vb exceeding the reference body potential Vb0. The gate voltage Vth, which is pulled up due to the application of the body potential Vb, will not be excessively reduced. Consequently, the gate threshold voltage Vth is easy to set, as already described.

Depending on the purpose of the semiconductor device, however, the gate threshold voltage Vth may be required to be further pulled up. In a semiconductor device according to the embodiment 2 of the present invention, a gate electrode 13 is made of a conductive material (referred to as a mid-gap material in this specification), having a work function at an intermediate value between those of $n^+$-type polysilicon and $p^+$-type polysilicon, other than a polycrystalline semiconductor. Thus, the gate threshold voltage Vth can be further flexibly set. In other words, the selection range for the gate threshold voltage Vth is further enlarged.

Figure 17:
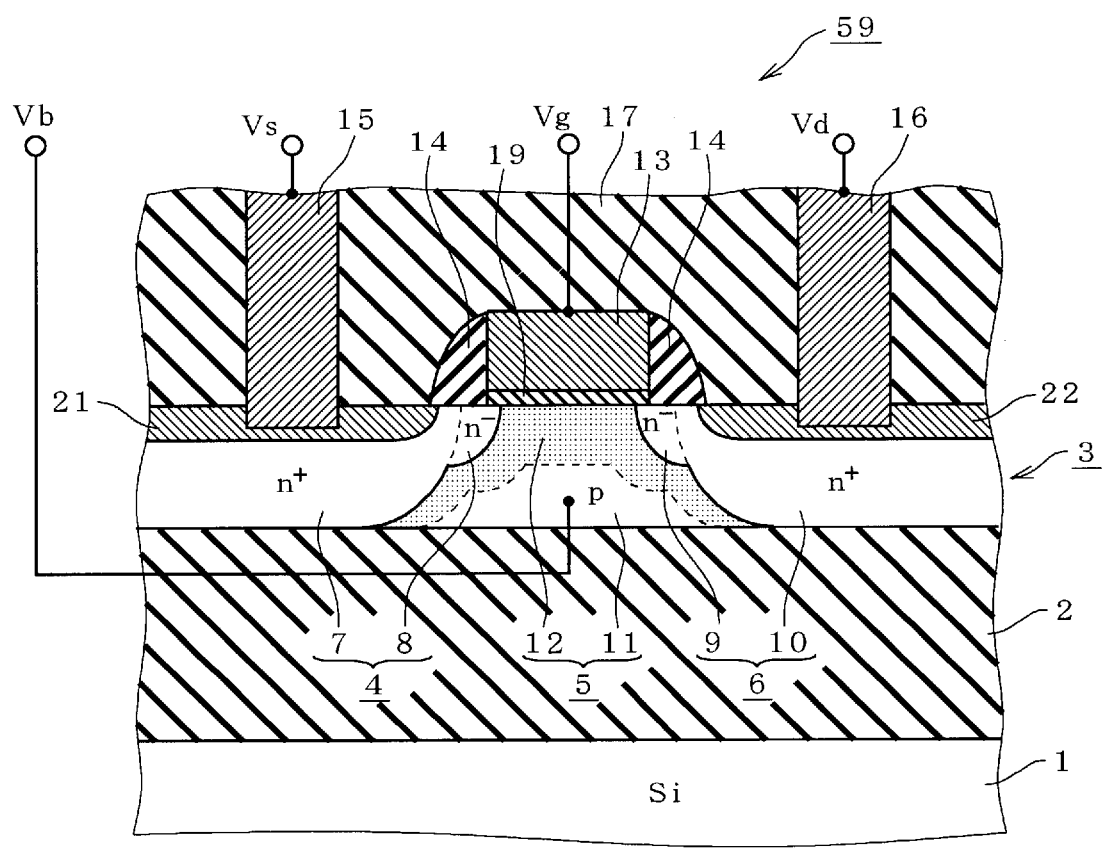
FIG. 17 is a front sectional view showing the semiconductor device according to the embodiment 2.

FIG. 17 is a front sectional view showing a semiconductor device 58 according to the embodiment 2. A MOSFET 59 included in this semiconductor device 58 is characteristically different from the MOSFET 32 (FIG. 1) in that a gate electrode 13 is made of a mid-gap material. For example, Ta (tantalum), Mg (magnesium), Cr (chromium), Co (cobalt) and W (tungsten) belong to mid-gap materials. Effects of the mid-gap material are now described with reference to energy band diagrams shown in FIGS. 18 to 21.

Figure 18:
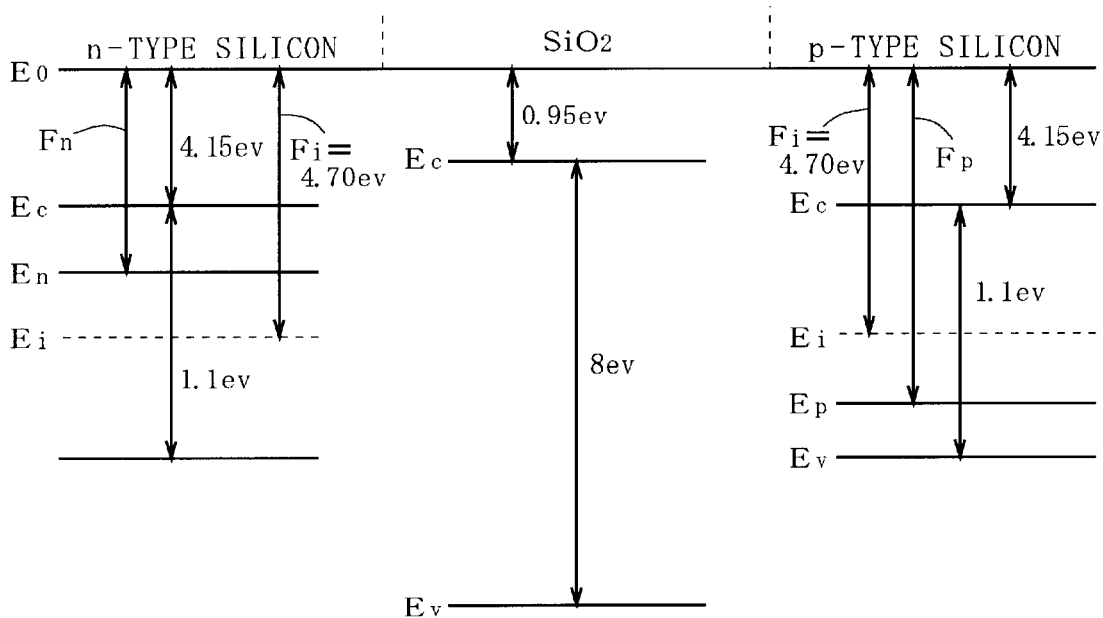
FIG. 18 is a band diagram illustrating operations of the semiconductor device according to the embodiment 2.

FIG. 18 shows energy band structures of n-type silicon, p-type silicon and a silicon oxide in comparison with each other. While the Fermi level Ei of intrinsic silicon is positioned intermediate between the level Ec of the bottom of a conductive zone and the level Ev of the top portion of a charge zone, the Fermi level En of n-type silicon shifts in a direction higher than the Fermi level Ei, and the Fermi level Ep of p-type silicon shifts to a low direction to the contrary. Consequently, the work function Fn of the n-type silicon is smaller than the work function Fi, which is 4.70 eV, of the intrinsic silicon while the work function Fp of the p-type silicon is larger than the work function Fi to the contrary. The values of shifting depend on the concentrations of the impurities.

Figure 19:
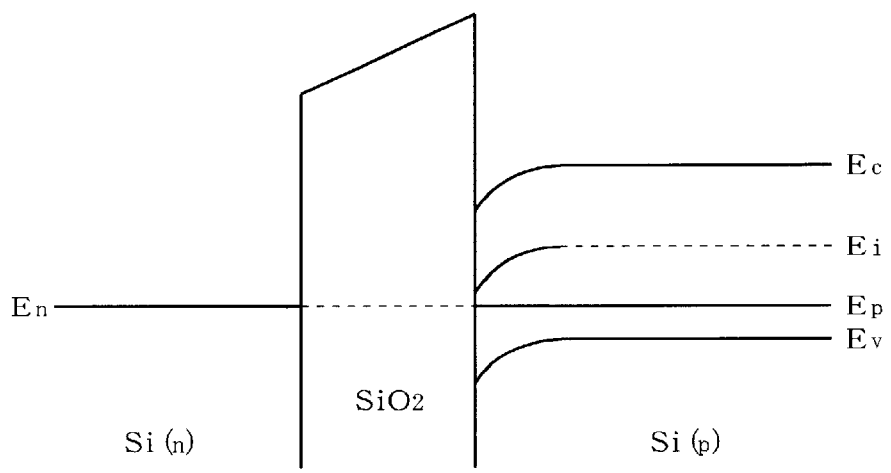
FIG. 19 is a band diagram illustrating operations of the semiconductor device according to the embodiment 2.

FIG. 19 shows the energy band structure of a semiconductor device having a gate electrode 13 of $n^+$-type polysilicon opposed to a body region 5 of p-type silicon through a gate insulator film 19 formed of a silicon oxide film. This semiconductor device corresponds to an NMOSFET having the gate electrode 13 made of polysilicon doped with an $n^+$-conductivity type impurity.

Figure 20:
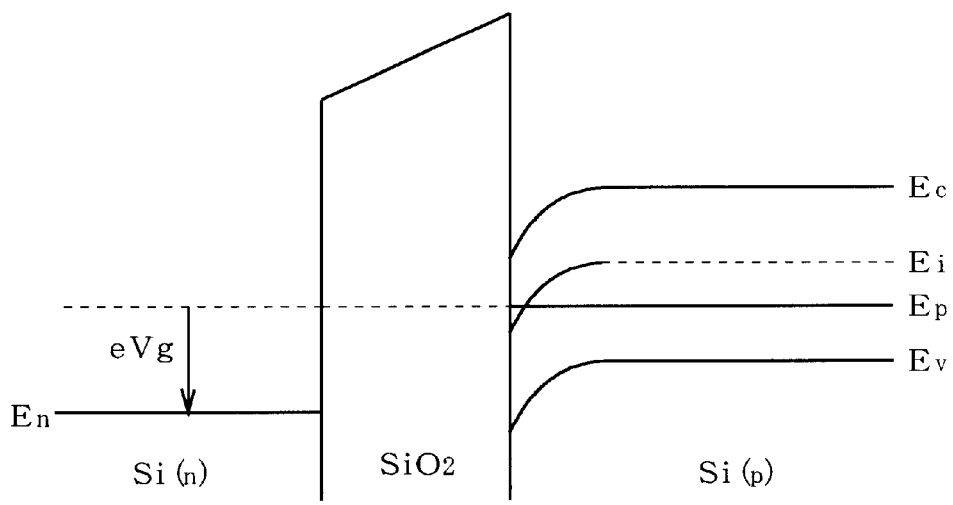
FIG. 20 is a band diagram illustrating operations of the semiconductor device according to the embodiment 2.

Between both silicon materials having different work functions, the Fermi levels En and Ep must be identical to each other in an equilibrium state. Therefore, an electric field is developed therebetween and the levels Ec and Ev are downwardly bent in an upper part of the body region 5. When a gate potential Vg is applied to the gate electrode 13, the Fermi level En lowers by e·Vg, as shown in FIG. 20. Following this, the levels Ec and Ev are more remarkably bent in the upper part of the body region 5.

When the gate potential Vg exceeds a certain level, i.e., a gate threshold voltage Vth, the Fermi level Ei drops below the Fermi level Ep in the upper part of the body region 5, as shown in FIG. 20. Consequently, an inversion layer is formed in the upper part. Therefore, the gate threshold voltage Vth lowers as the difference between the work functions (i.e., the difference between the Fermi levels) of the body region S and the gate electrode 13 increases.

Figure 21:
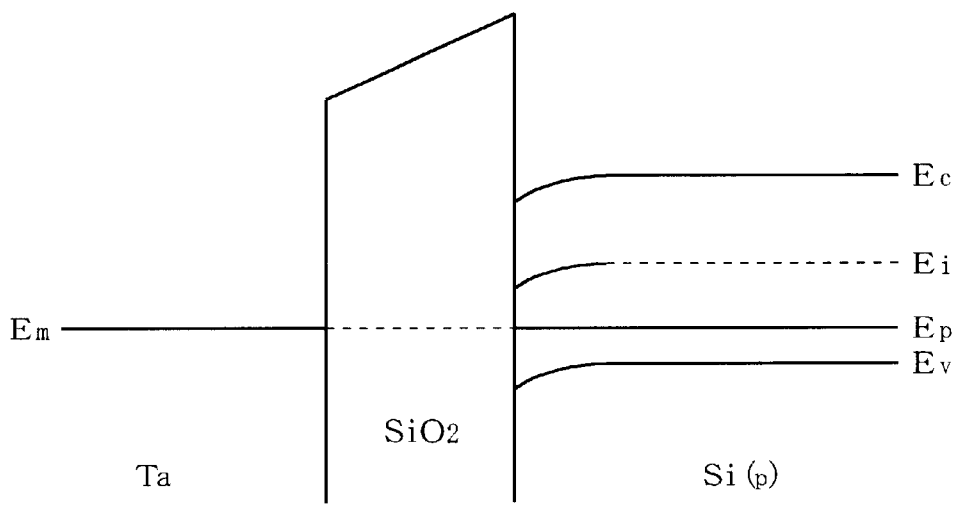
FIG. 21 is a band diagram illustrating operations of the semiconductor device according to the embodiment 2.

Therefore, bending of the levels Ec and Ev in the upper part of the body region can be relaxed by employing a material such as Ta, for example, having a work function positioned intermediate between those of the $n^+$-type polysilicon and the $p^+$-type polysilicon for the gate electrode 13, as shown in FIG. 21. Thus, the gate threshold voltage Vth can be increased.

In general, the impurity concentration of the $n^+$-type polysilicon and the p+type polysilicon employed as the material for the gate electrode 13 is set higher than $5×10^{20}/cm^3$, in order to ensure conductivity. A Fermi level corresponding to this concentration is ±0.63 V with reference to the Fermi level Ei. Therefore, a conductive material which is neither n-type polysilicon nor p-type polysilicon (in general, not a polycrystalline semiconductor doped with an impurity) with a Fermi level higher than −0.63 V and lower than +0.63 V is nothing else but the aforementioned mid-gap material. In order to further clarify the difference between the gate threshold voltages Vth in the case of employing $n^+$-type polysilicon and $p^+$-type polysilicon and the case of employing the mid-gap material, a mid-gap material having a Fermi level in the range of −0.5 V to +0.5 V may be selected, for example.

While the above description has been made with reference to an NMOSFET, this also applies to a PMOSFET. Also in the PMOSFET, the gate threshold voltage Vth can be increased by employing the mid-gap material as the material for the gate electrode 13 in place of $p^+$-type polysilicon.

3. Embodiment 3

Figure 23:
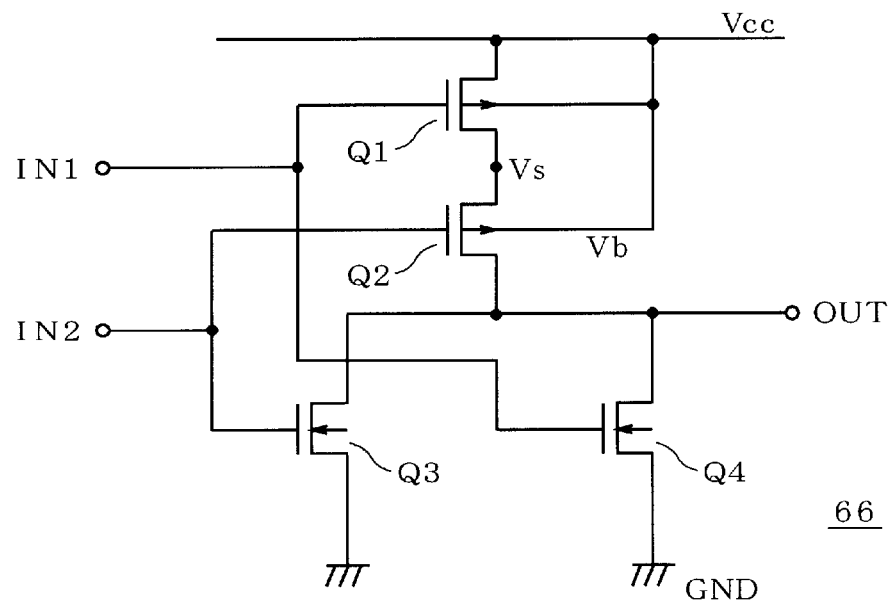
FIG. 23 is a circuit diagram of another semiconductor device according to the embodiment 3 of the present invention.
Figure 24:
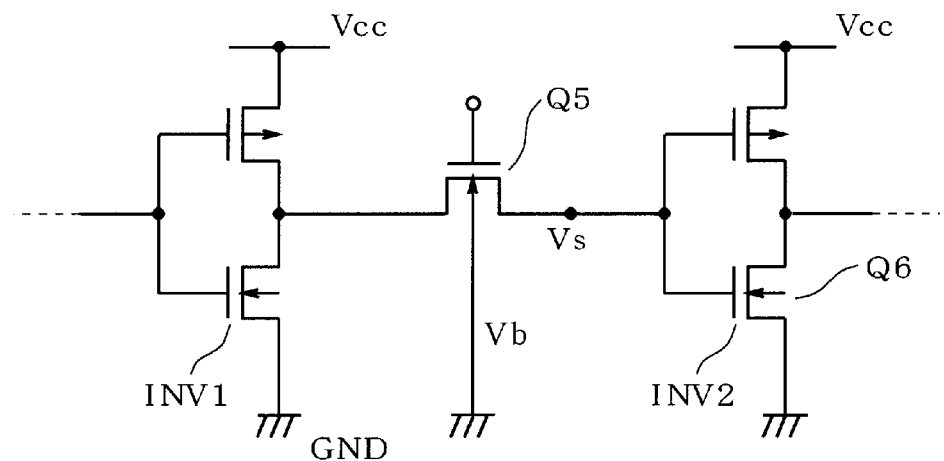
FIG. 24 is a circuit diagram of still another semiconductor device according to the embodiment 3 of the present invention.

In relation to an embodiment 3 of the present invention, description is made on a semiconductor device formed to implement operations of FD and PD modes respectively by varying channel widths W between a plurality of MOSFETs included in a semiconductor device thereby improving homogeneity of gate threshold voltages Vth. Circuit diagrams of FIGS. 22 to 24 show three exemplary semiconductor devices 65, 66 and 67 structured as described above.

Figure 22:
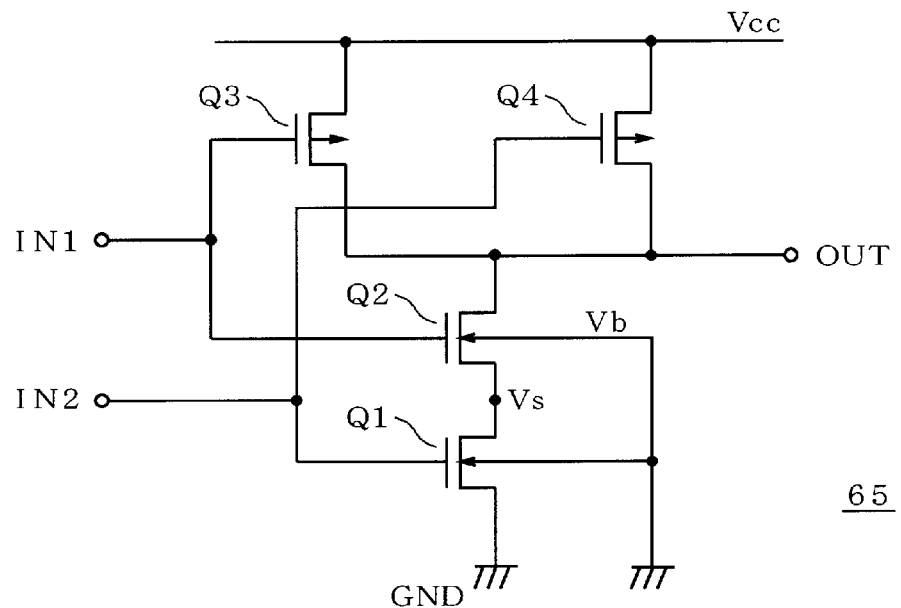
FIG. 22 is a circuit diagram of a semiconductor device according to an embodiment 3 of the present invention.

The semiconductor device 65 shown in FIG. 22 includes a two-input NAND circuit. Four MOSFETs Q1 to Q4 are connected between a power supply line transmitting a ground potential GND and a power supply line transmitting a positive power supply potential Vcc. The MOSFETs Q1 and Q2, which are n-channel MOSFETs, are serially connected with each other. A source electrode of the MOSFET Q1 is connected to the power supply line for the ground potential GND.

On the other hand, the MOSFETs Q3 and Q4 are p-channel MOSFETs, which are connected in parallel with each other. Source electrodes thereof are connected to the power supply line for the power supply potential Vcc in common. Further, drain electrodes of the MOSFETs Q3 and Q4 are connected to that of the MOSFET Q2. A connection part between the MOSFETs Q3 and Q4 functions as an output part OUT.

Gate electrodes of the MOSFETs Q2 and Q3 are connected to an input part IN1 in common, while those of the MOSFETs Q1 and Q4 are connected to an input part IN2 in common. Consequently, a logical signal corresponding to NAND of logical signals inputted in the two input parts IN1 and IN2 is outputted to the output part OUT as an operation result.

In this semiconductor device 65, body electrodes of the MOSFETs Q1 and Q2 are connected to the power supply line for the ground potential GND in common. In other words, the MOSFETs Q1 and Q2 are supplied with the ground potential GND as a body potential Vb. Since the MOSFET Q1 intervenes between the MOSFET Q2 and the power supply line for the ground potential GND, a source potential Vs of the MOSFET Q2 does not necessarily coincide with the ground potential GND.

In general, the source potential Vs of the MOSFET Q2 is positive and the body potential Vb thereof is at a negative value with reference to the source potential Vs when the MOSFET Q1 is in a cutoff state. In other words, the MOSFET Q2 is in contrast to the MOSFET Q1 having the body potential Vb regularly remaining zero with reference to the source potential Vs.

When these MOSFETs Q1 and Q2 are formed identically to each other with common channel widths W, the gate threshold voltage Vth of the MOSFET Q2 is higher than that of the MOSFET Q1. When the gate threshold voltage Vth increases, the value of a main current in a conducting state, i.e., current drivability lowers. Consequently, the operating speed lowers.

In the semiconductor device 65, the channel widths W of the MOSFETs Q1 and Q2 are set at different values, in order to cause no such inconvenience. In other words, the channel width W of the MOSFET Q2 is set larger than the channel width W of the MOSFET Q1. In the MOSFET Q2, further, the channel width W is set larger than a saturation start width. Even if the body potential Vb of the MOSFET Q2 increases in a negative direction beyond a reference body potential Vb0, therefore, the gate threshold voltage Vth is suppressed to a saturated value with no increase.

On the other hand, the channel width W of the MOSFET Q1 is set smaller than a saturation start width. Thus, equality in the gate threshold voltages Vth is improved between the MOSFETs Q1 and Q2. Since the gate threshold voltages Vth of both MOSFETs Q1 and Q2 are suppressed, the operating speed of the overall NAND circuit is maintained high. Further, it is possible to drive the NAND circuit while suppressing the power supply potential Vcc at a low value. In other words, the NAND circuit can perform a low-voltage operation.

The semiconductor device 66 shown in FIG. 23 includes a two-input NOR circuit. This NOR circuit is complementary with the NAND circuit shown in FIG. 22. Four MOSFETs Q1 to Q4 are connected between a power supply line transmitting a ground potential GND and a power supply line transmitting a power supply potential Vcc. The MOSFETs Q1 and Q2, which are p-channel MOSFETs, are serially connected with each other. A source electrode of the MOSFET Q1 is connected to the power supply line for the power supply potential Vcc.

On the other hand, the MOSFETs Q3 and Q4 are n-channel MOSFETs, which are connected in parallel with each other. Source electrodes thereof are connected to the power supply line for the ground potential GND in common. Further, drain electrodes of the MOSFETs Q3 and Q3 are connected to that of the MOSFET Q2. A connection part between the MOSFETs Q3 and Q3 function as an output part OUT.

Gate electrodes of the MOSFETs Q1 and Q4 are connected to an input part IN1 in common, and those of the MOSFETs Q2 and Q3 are connected to an input part IN2 in common. Consequently, a logical signal corresponding to NOR of logical signals inputted in the two input parts IN1 and IN2 is outputted to the output part OUT as an operation result.

The MOSFETs Q1 and Q2 are supplied with the power supply potential Vcc as a body potential Vb. Since the MOSFET Q1 intervenes between the MOSFET Q2 and the power supply line for the power supply potential Vcc, the source potential Vs of the MOSFET Q2 does not necessarily coincide with the power supply potential Vcc. In the MOSFET Q1, on the other hand, the body potential Vb is regularly maintained zero with reference to the source potential Vs. That is, the MOSFETs Q1 and Q2 of this circuit are equivalent to the MOSFETs Q1 and Q2 shown in FIG. 22 in relation to the value of the body potential Vb.

Therefore, the channel width W of the MOSFET Q2 is set larger than the channel width W of the MOSFET Q1. In the MOSFET Q2, further, the channel width W is set larger than a saturation start width. Even if the body potential Vb of the MOSFET Q2 increases in a positive direction beyond a reference body potential Vb0, therefore, the gate threshold voltage Vth is suppressed to a saturated value with no increase.

On the other hand, the channel width W of the MOSFET Q1 is set smaller than the saturation start width. Thus, equality in the gate threshold voltages Vth is improved between the MOSFETs Q1 and Q2. The gate threshold voltages Vth of both MOSFETs Q2 and Q2 are suppressed, whereby the operating speed of the overall NOR circuit is maintained high. Further, the NOR circuit can perform a low-voltage operation.

The semiconductor device 67 shown in FIG. 24 includes inverters INV1 and INV2 cascade-connected in two stages and a MOSFET Q5 interposed therebetween for functioning as a pass transistor. Each of the inverters INV1 and INV2 has an n-channel MOSFET and a p-channel MOSFET serially connected with each other, which are interposed between a power supply line transmitting a ground potential GND and a power supply line transmitting a power supply potential Vcc.

The MOSFET Q5 is an n-channel MOSFET having a source electrode connected to an input part of the inverter INV2, i.e., a connection part between gate electrodes of two MOSFETs provided on the inverter INV2. A body electrode of the MOSFET Q5 is connected to the power supply line for the ground potential GND. In other words, the MOSFET Q5 is supplied with the ground potential GND as a body potential Vb.

Since the n-channel MOSFET Q6. belonging to the inverter INV2 intervenes between the MOSFET Q5 and the power supply line for the ground potential GND, the source potential Vs of the MOSFET Q5 does not necessarily coincide with the ground potential GND. On the other hand, the body potential Vb of the MOSFET Q6 regularly coincides with the source potential Vs, i.e., the ground potential GND. These circumstances related to the MOSFETs Q5 and Q6 are equivalent to those related to the MOSFETs Q2 and Q1, although the MOSFETs Q2 and Q1 shown in FIG. 22 are serially connected with each other while the MOSFETs Q5 and Q6 are cascade-connected with each other.

Therefore, the channel widths W of the MOSFETs Q5 and Q6 are set at different values. Specifically, the channel width W of the MOSFET Q5 is set larger than that of the MOSFET Q6. In the MOSFET Q5, further, the channel width W is set larger than the saturation start width. Even if the body potential Vb of the MOSFET Q5 increases in a negative direction beyond the reference body potential Vb0, therefore, the gate threshold voltage Vth is suppressed at the saturated value with no increase.

On the other hand, the channel width W of the MOSFET Q6 is set smaller than the saturation start width. Thus, equality in the gate threshold voltages Vth is improved between the MOSFETs Q5 and Q6. Further, the gate threshold voltages Vth of both MOSFETs Q5 and Q6 are suppressed, whereby the operating speed of the overall circuit shown in FIG. 24 is maintained high. In addition, the circuit can perform a low-voltage operation.

4. Embodiment 4

The value of a saturation start width depends on both of a thickness T and a channel length L. The general relation between these values is now described for extending the conditions related to the channel widths W in the embodiments 1 and 3 to more general ones on the basis of the result.

Figure 25:
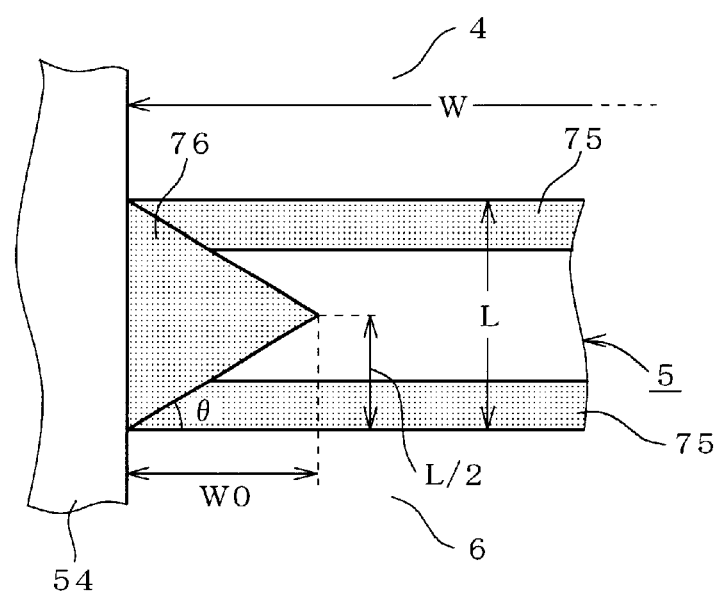
FIG. 25 is an explanatory diagram showing the principle of a semiconductor device according to an embodiment 4 of the present invention.

FIG. 25 is a plan view showing the structures of depletion layers in a body region 5 with reference to the MOSFET 32 or 50 shown in FIG. 1 or 5 in an enlarged manner. A depletion layer 75 extends from source/drain regions 4 and 6 toward a central part along the channel length L of the body region 5, while a depletion layer 76 extends from a body region 54 toward a central part along the channel width W of the body region 5.

Referring to FIG. 25, a width W0 defines the range of an electric field from the body region 54 penetrating the body region 5. Relation: $L/(2 \cdot W0) = \tan \theta$, holds between an angle $\theta$, the penetration width W0 and the channel length L in FIG. 25. A body bias effect appears when the penetration width W0 occupies a certain ratio C with respect to the channel width W. In other words, the body bias effect appears if W0/W>C, while no body bias effect appears if W0/W≤C. Therefore, no body bias effect appears under a condition of $L/W \leq 2 \cdot \tan \theta \cdot C$.

In the example shown in FIG. 10, L/W=0.35 μm/0.8 μm=0.44 when the channel width W is identical with the saturation start width (=0.8 μm). In other words, the condition W≧0.8 μm related to the channel width W allowing appearance of saturation on the gate threshold voltage Vth resulting from full depletion can be generalized to L/W≦0.44, if the thickness T is 100 nm. The value 0.44 on the right side varies with the thickness T.

At whatever value the thickness T is set, however, it can be formulated that the ratio L/W must be smaller than a certain reference ratio (referred to as "saturation start ratio" in this specification) depending on the thickness T, in order to saturate the gate threshold voltage Vth. This general condition has been confirmed through experiments and simulations.

Therefore, the condition related to the channel width W described with reference to the embodiments 1 and 3, i.e., such a condition that the channel width W is larger than the saturation start width can be extended to such a condition that the ratio L/W is smaller than the saturation start ratio. This extended condition is equivalent to an operation of setting the channel length L at a value smaller than a "saturation start length" defined by the product of the channel width W and the saturation start ratio when the thickness T and the channel width W are given. Thus, saturation of the gate threshold voltage Vth derived from full depletion can be allowed by adjusting not only the channel width W but also the channel length L.

With reference to the MOSFETs Q1 and Q2 shown in FIG. 22, the channel widths W thereof may be set identical to each other while setting the channel length L of the MOSFET Q2 smaller than that of the MOSFET Q1. In this case, the channel length L is set smaller than the saturation start length in the MOSFET Q2, while the channel length L of the MOSFET Q1 is set larger than the saturation start length.

5. Embodiment 5

In relation to the above embodiments, various modes of a semiconductor device having a MOSFET which is formed equivalently to a MOSFET of a PD mode and operates in an FD mode have been presented. In relation to an embodiment 5 of the present invention, a semiconductor device having a MOSFET operating in a PD mode and positively utilizing a substrate bias effect is described.

Figure 26:
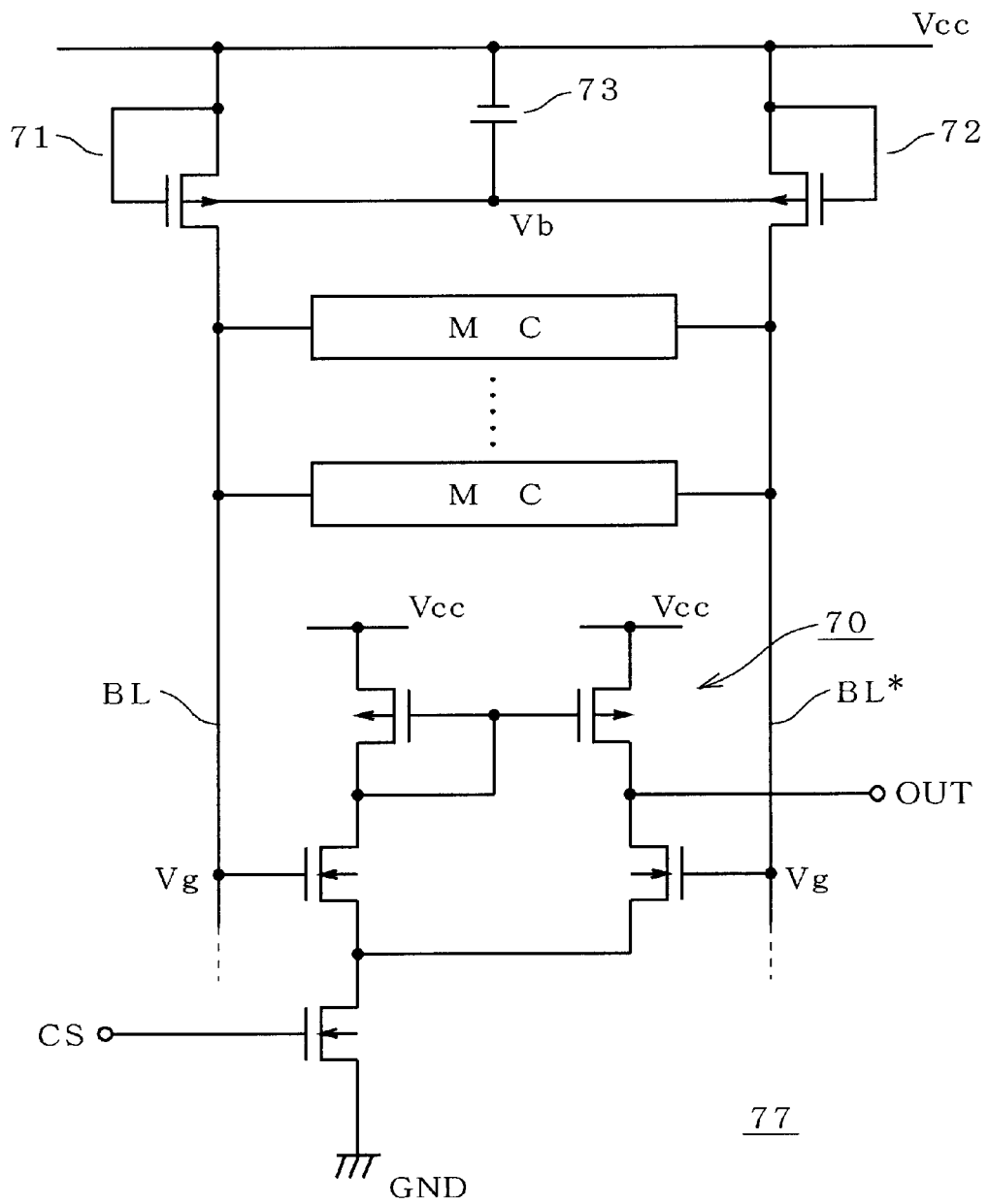
FIG. 26 is a circuit diagram of a semiconductor device according to an embodiment 5 of the present invention.
Figure 27:
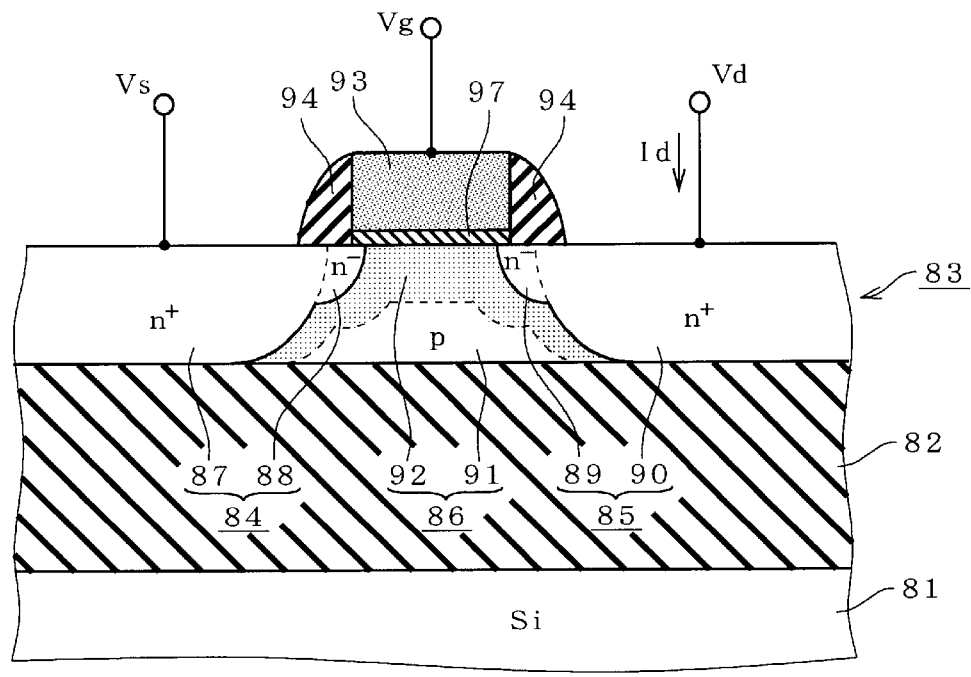
FIG. 27 is a front sectional view of a conventional semiconductor device.
Figure 28:
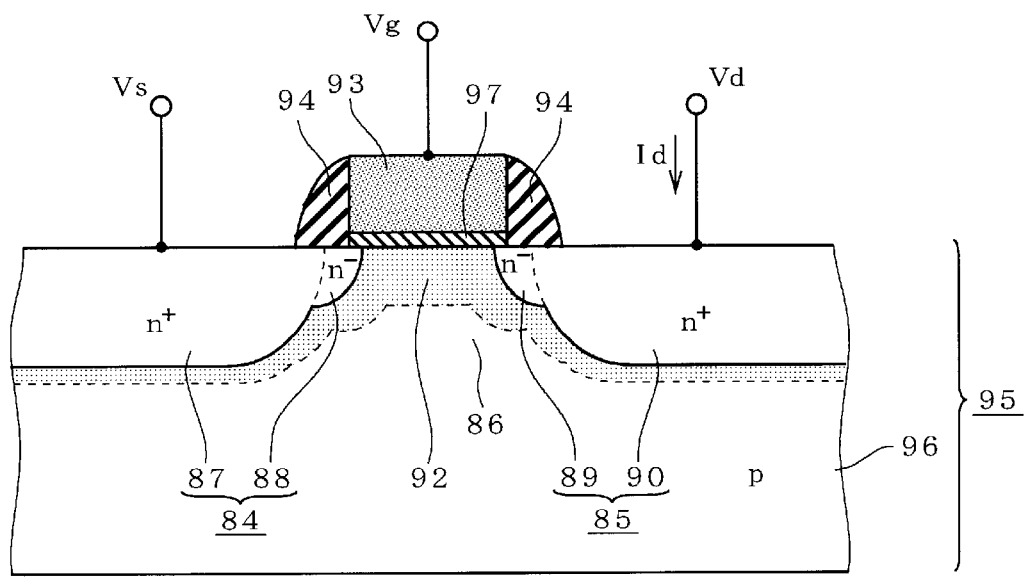
FIG. 28 is a front sectional view of another conventional semiconductor device.
Figure 29:
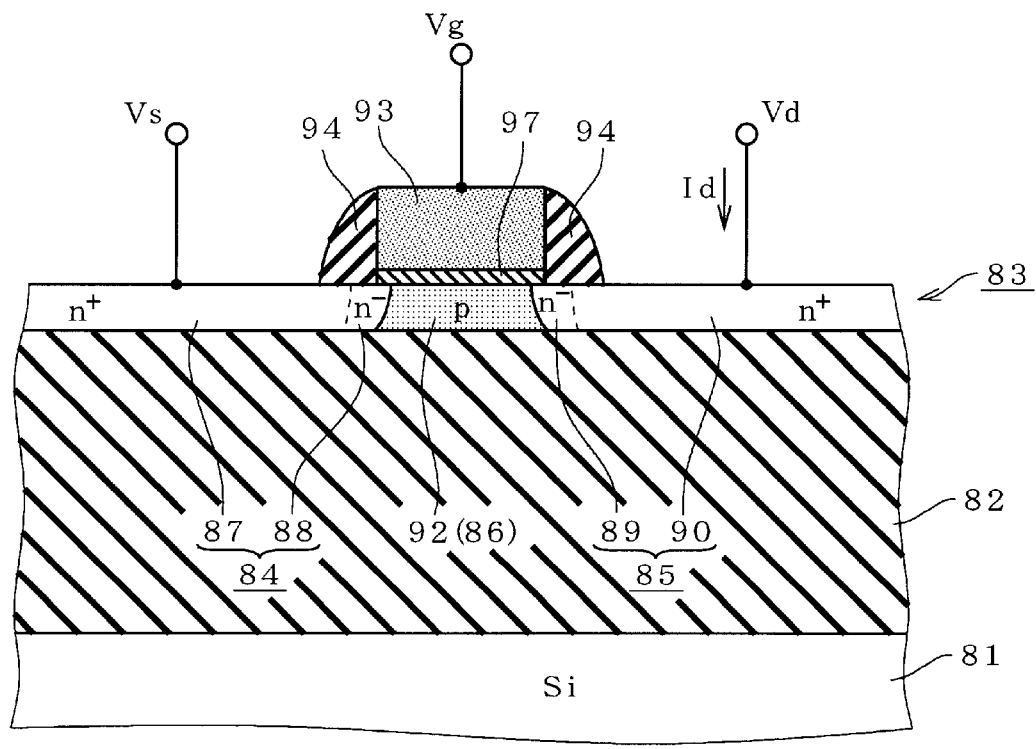
FIG. 29 is a front sectional view of still another conventional semiconductor device.
Figure 30:
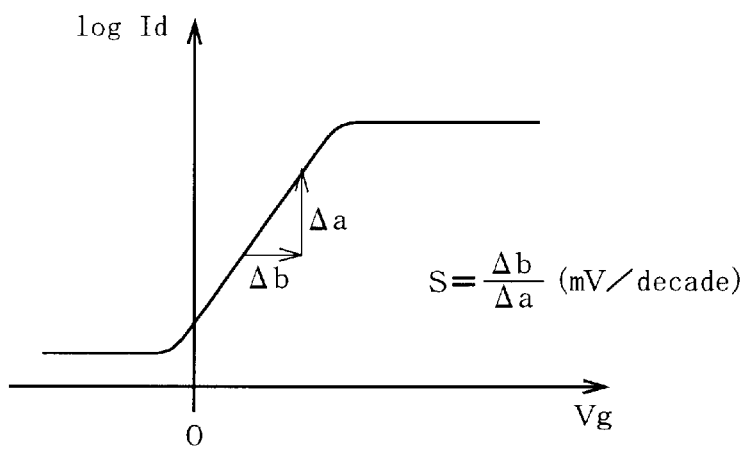
FIG. 30 is a graph for illustrating an S factor.

FIG. 26 is a circuit diagram showing the circuit structure of a semiconductor device 77 according to the embodiment 5. The semiconductor device 77 is formed as a DRAM, and comprises a number of memory cells MC interposed between a pair of bit lines BL and BL*, a sense amplifier 70 similarly interposed between the pair of bit lines BL and BL*, MOSFETs 71 and 72 serving as bit line loads, and a power supply part 73.

The MOSFETs 71 and 72 are interposed between a power supply line transmitting a power supply potential Vcc and the bit lines BL and BL* respectively. The MOSFETs 71 and 72 are p-channel MOSFETs, which are supplied with a potential higher than the power supply potential Vcc by the power supply part 73 as a body potential Vb. The sense amplifier 70 is formed as a current mirror differential amplifier, for amplifying the potential difference between the bit lines BL and BL* and outputting an amplified signal as an output signal OUT when a high-level (active level) signal is inputted as a selection signal CS.

As a voltage drop caused by the MOSFETs 71 and 72 serving as bit line loads increases, the gain of the sense amplifier 70 increases. The level of the voltage drop caused by the MOSFETs 71 and 72 substantially coincides with the gate threshold voltage Vth of the MOSFETs 71 and 72. Therefore, the gate threshold voltage Vth of the MOSFETs 71 and 72 is preferably set at a high level, in order to increase the gain of the sense amplifier 70. In response to this requirement, each of the MOSFETs 71 and 72 is formed similarly to the MOSFET 32a shown in FIG. 11, for example.

However, the channel width W and the channel length L are set in the ranges allowing no appearance of saturation on the gate threshold voltage Vth. In other words, the ratio L/W is set larger than the saturation start ratio. If the thickness T is 100 nm, for example, the ratio L/W is set to be larger than 0.44 (L/W>0.44).

The power supply part 73 supplies a potential higher than the power supply potential Vcc to the MOSFETs 71 and 72 as the body potential Vb. In the MOSFETs 71 and 72, the gate threshold voltage Vth is high due to appearance of a substrate bias effect. Consequently, the gain of the sense amplifier 70 is enhanced. Since the ratio L/W is set higher than the saturation start ratio, the MOSFETs 71 and 72 operate not in an FD mode but in a PD mode even if a high potential is supplied as the body potential Vb.

Thus, the semiconductor device 77 is provided with the MOSFETs 71 and 72 having the ratio L/W set larger than the saturation start ratio, and the gate threshold voltage Vth of these MOSFETs 71 and 72 is set at a high level by positively attaining the substrate bias effect. Further, the MOSFETs 71 and 72 are formed as MOSFETs operable in the PD mode. For this purpose, an SOI layer is set sufficiently thick. Thus, the MOSFETs 71 and 72 attain such advantages that resistance of the source/drain regions 4 and 6 is low, contact holes for main electrodes 15 and 16 are easy to form and silicide layers 21 and 22 can be readily formed on surfaces of the source/drain regions 4 and 6, similarly to the MOSFET 32a.

Further, although the MOSFETs 71 and 72 operate in the PD mode, a p-type semiconductor region 11 (FIG. 11) positioned immediately under the depletion layer 12 is not in a floating state but supplied with a potential higher than the power supply potential Vcc as the body potential Vb. In the MOSFETs 71 and 72, therefore, problems of instability of the gate threshold voltage Vth and increase in a leakage current are relaxed or solved, dissimilarly to the conventional semiconductor device 151.

The MOSFETs 71 and 72 serving as bit line loads shown in FIG. 26 are p-channel MOSFETs. However, a DRAM having n-channel MOSFETs as bit line loads can also be formed, as a matter of course. Further, bit lines of not only a DRAM but a general semiconductor memory having bit lines, bit line loads and a sense amplifier can be formed by MOSFETs similar to the MOSFETs 71 and 72, to attain similar effects.

While the MOSFETs 71 and 72 positively utilizing the substrate bias effect attain remarkable effects in a semiconductor memory as hereinabove described, the application thereof is not restricted to the semiconductor memory. The substrate bias effect can be positively utilized in a general SOI semiconductor device having MOSFETs requiring a high gate threshold voltage Vth, similarly to the MOSFETs 71 and 72.

6. Modifications

In the semiconductor device shown in FIG. 3, 4, 12 or 13, the channel length L and the channel width W can alternatively set at values allowing no saturation of the gate threshold voltage Vth, i.e., in the ranges satisfying the condition L/W>saturation start ratio. In this case, the semiconductor device cannot be driven in the FD mode. However, it is possible to drive the semiconductor device while applying the body potential Vb (i.e., applying a substrate bias) in a direction for enlarging a depletion layer of the body region without bringing the device into a floating state. Therefore, the problems of instability of the gate threshold voltage Vth and increase in a leakage current are relaxed or solved.

Further, since the SOI layer is set in a large thickness equivalently to the conventional PD-mode MOSFET, such advantages that resistance of source/drain regions is low, contact holes for main electrodes are easy to form, and silicide layers can be readily formed on the source/drain regions can be attained similarly to the semiconductor device shown in FIG. 3 or the like.

7. Incorporation by Reference

The entire contents of each of the following three references 1 to 3 are incorporated herein by reference.

Ref. 1: S. Maeda et al., "A Highly Reliable 0.35 $\mu$m Field-Shield Body-Tied SOI Gate Array for Substrate-Bias-Effect Free Operation," 1997 Symposium on VLSI Technology Digest of Technical Papers, pp. 93–94;

Ref. 2: T. Iwamatsu et al., "CAD-Compatible High-Speed CMOS/SIMOX Technology Using Field-Shield Isolation for 1M Gate Array," Proceedings of IEDM 93, pp. 475–478; and Ref. 3: S. Maeda et al., "Substrate-Bias Effect and Source-Drain Breakdown Characteristics in Body-Tied Short-Channel SOI MOSFET's," IEEE Transactions on Electron Devices, Vol. 46, No. 1, January (1999), pp. 151–158.

FIGS. 1 to 3 of the Ref. 1 supplement FIGS. 7 and 8 of the present application in relation to the configuration of the field shield isolation. Further, FIGS. 4 and 8 of the Ref. 1 show experimental data on which FIG. 10 of the present application is based. FIG. 1 of the Ref. 2 shows another manufacturing method of the field shield isolation structure. FIGS. 6 to 8 of the Ref. 2 show examples of the structure manufactured with the method shown in FIG. 1. FIG. 10 of the Ref. 3 shows original data from which FIG. 10 of the present application is derived.

While the invention has been shown and described in detail, the foregoing description is in all aspects illustrative and restrictive. It is therefore understood that numerous modifications and variations can be devised without departing from the scope of the invention.

We claim:

1. A semiconductor device provided with circuit elements in a semiconductor chip having an SOI layer, comprising a MOSFET and a power supply part as said circuit elements, said MOSFET comprising a source region and a drain region selectively formed in said SOI layer and a body region held between said source region and said drain region, the thickness of said SOI layer being set at a value not fully depleting said body region under a floating condition and a condition supplied with the same potential as said source region, and said power supply part generating a voltage of a constant level and supplying said voltage between said source region and said body region in a direction for enlarging a depletion layer formed in said body region.

2. The semiconductor device in accordance with claim 1, wherein
a ratio L/W of the channel length L to the channel width W of said MOSFET is set smaller than a saturation start ratio.

3. The semiconductor device in accordance with claim 2, wherein
said voltage is set at a level saturating a gate threshold voltage of said MOSFET.

4. The semiconductor device in accordance with claim 3, wherein
said MOSFET further comprises a gate electrode opposed to said body region through an insulator layer and made of a mid-gap material.

5. The semiconductor device in accordance with claim 2, wherein
said MOSFET further comprises a gate electrode opposed to said body region through an insulator layer and made of a mid-gap material.

6. The semiconductor device in accordance with claim 1, wherein
a ratio L/W of the channel length L to the channel width W of said MOSFET is set larger than a saturation start ratio.

7. The semiconductor device in accordance with claim 6, further comprising a memory cell, a bit line connected to said memory cell and a sense amplifier connected to said bit line, wherein
said MOSFET is connected to said bit line as a bit line load.

8. The semiconductor device in accordance with claim 1, wherein
a semiconductor metal compound layer is formed on surfaces of said source region and said drain region.

9. The semiconductor device in accordance with claim 8, wherein
said MOSFET further comprises a gate electrode opposed to said body region through an insulator layer, and
said gate electrode comprises a polycrystalline semiconductor layer doped with an impurity and a semiconductor -metal compound layer formed on said polycrystalline semiconductor layer.

10. A semiconductor device provided with a circuit element in a semiconductor chip having an SOI layer, comprising;
a MOSFET as said circuit element, wherein,
said MOSFET comprising a source region and a drain region selectively formed in said ASOI layer and a body region held between said source region and said drain region,
a thickness of said SOI layer being set at a value not fully depleting said body region under a floating condition and a condition supplied with the same potential as said source region,
a ratio L/W of a channel length L to a channel width W of said MOSFET is set smaller than a saturation start ratio, and
said semiconductor device further comprising a terminal for being externally supplied with a voltage for relaying said voltage to said source region and said body region.

11. The semiconductor device in accordance with claim 10, wherein
a semiconductor metal compound layer is formed on surfaces of said source region and said drain region.

12. The semiconductor device in accordance with claim 11, wherein
said MOSFET further comprises a gate electrode opposed to said body region through an insulator layer, and
said gate electrode comprises a polycrystalline semiconductor layer doped with an impurity and a semiconductor-metal compound layer formed on said polycrystalline semiconductor layer.

13. A semiconductor device provided with circuit elements in a semiconductor chip having an SOI layer,
comprising first and second MOSFETs and a power supply line as said circuit elements,
each of said first and second MOSFETs comprising a source region and a drain region selectively formed in said SOI layer and a body region held between said source region and said drain region,
the thickness of said SOI layer being set at a value not fully depleting said body region of each of said first and second MOSFETs under a floating condition and a condition supplied with the same potential as said source region,
both of said source region and said body region belonging to said first MOSFET being connected to said power supply line,
said first MOSFET intervening between said source region belonging to said second MOSFET and said power supply line,
said body region belonging to said second MOSFET being connected to said power supply line,
a ratio L/W of the channel length L to the channel width W of said first MOSFET being set larger than a saturation start ratio, and
a ratio L/W of the channel length L to the channel width W of said second MOSFET being set smaller than a saturation start ratio.

14. The semiconductor device in accordance with claim 13, wherein
either said channel lengths or said channel widths are set at the same value between said first and second MOSFETs.

15. The semiconductor device in accordance with claim 13, wherein
a semiconductor metal compound layer is formed on surfaces of said source region and said drain region.

16. The semiconductor device in accordance with claim 15, wherein
said MOSFET further comprises a gate electrode opposed to said body region through an insulator layer, and
said gate electrode comprises a polycrystalline semiconductor layer doped with an impurity and a semiconductor-metal compound layer formed on said polycrystalline semiconductor layer.

17. A semiconductor device, comprising:
a semiconductor chip including a MOSFET and a power supply part and having an SOI layer, wherein
said MOSFET includes a source region and a drain region selectively formed in said SOI layer and a body region held between said source region and said drain region,
a thickness $T_{SOI}$ of said SOI layer and a channel width W of said MOSFET are configured such that $W/T_{SOI} > 8$, and
said power supply part is configured to generate a voltage of a constant level and supply said voltage between said source region and said body region in a direction such that a depletion layer formed in said body region is enlarged.

18. The semiconductor device of claim 17, wherein a ratio L/W of a channel length L to a channel width W of said MOSFET is set smaller than a saturation start ratio.

19. The semiconductor device of claim 18, wherein said voltage is set at a level saturating a gate threshold voltage of said MOSFET.

20. The semiconductor device of claim 19, wherein said MOSFET further comprises a gate electrode opposed to said body region through an insulator layer and made of a mid-gap material.

21. The semiconductor device of claim 18, wherein said MOSFET further comprises a gate electrode opposed to said body region through an insulator layer and made of a mid-gap material.

22. The semiconductor device of claim 17, wherein a semiconductor metal compound layer is formed on surfaces of said source region and said drain region.

23. The semiconductor device of claim 22, wherein:
said MOSFET further comprises a gate electrode opposed to said body region through an insulator layer, and
said gate electrode comprises a polycrystalline semiconductor layer doped with an impurity and a semiconductor-metal compound layer formed on said polycrystalline semiconductor layer.

24. The semiconductor device of claim 17, wherein
a ratio L/W of a channel length L to a channel width W of said MOSFET is set smaller than a saturation start ratio, and
said semiconductor device further comprising a terminal for being externally supplied with a voltage for relaying said voltage to said source region and said body region.

25. The semiconductor device of claim 24, wherein a semiconductor metal compound layer is formed on surfaces of said source region and said drain region.

26. The semiconductor device of claim 25, wherein
said MOSFET further comprises a gate electrode opposed to said body region through an insulator layer, and
said gate electrode comprises a polycrystalline semiconductor layer doped with an impurity and a semiconductor-metal compound layer formed on said polycrystalline semiconductor layer.

* * * * *

UNITED STATES PATENT AND TRADEMARK OFFICE
CERTIFICATE OF CORRECTION

PATENT NO. : 6,414,353 B2
DATED : July 2, 2002
INVENTOR(S) : Maeda et al.

It is certified that error appears in the above-identified patent and that said Letters Patent is hereby corrected as shown below:

<u>Title page,</u>
The CPA information has been omitted. Item [45] and the Notice information should read as follows:
-- [45] **Date of Patent:  \*Jul. 2, 2002** --

-- [\*] Notice: This patent is issued on a continued prosecution
application filed under 37 CFR 1.53(d), and is
subject to the twenty year patent term provisions
of 35 U.S.C 154(a)(2).

Subject to any disclaimer, the term of this
patent is extended or adjusted under 35
U.S.C. 154(b) by 0 days. --

Signed and Sealed this

Twelfth Day of November, 2002

*Attest:*

*Attesting Officer*

JAMES E. ROGAN
*Director of the United States Patent and Trademark Office*